(12) United States Patent
Tsai et al.

(10) Patent No.: US 11,164,824 B2
(45) Date of Patent: Nov. 2, 2021

(54) PACKAGE STRUCTURE AND METHOD OF FABRICATING THE SAME

(71) Applicant: Taiwan Semiconductor Manufacturing Co., Ltd., Hsinchu (TW)

(72) Inventors: Tsung-Fu Tsai, Changhua County (TW); Kung-Chen Yeh, Taichung (TW); Li-Chung Kuo, Taipei (TW); Szu-Wei Lu, Hsinchu (TW); Ying-Ching Shih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 12 days.

(21) Appl. No.: 16/865,432

(22) Filed: May 4, 2020

(65) Prior Publication Data
US 2021/0066211 A1 Mar. 4, 2021

Related U.S. Application Data

(60) Provisional application No. 62/892,554, filed on Aug. 28, 2019.

(51) Int. Cl.
*H01L 23/495* (2006.01)
*H01L 23/00* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC . H01L 21/4853; H01L 21/78; H01L 21/4857; H01L 21/565; H01L 23/562;
(Continued)

(56) References Cited

U.S. PATENT DOCUMENTS 8,058,101 B2 * 11/2011 Haba .................. H01L 21/56
438/109
8,270,176 B2 * 9/2012 Pagaila ............... H01L 23/3128
361/760
(Continued)

FOREIGN PATENT DOCUMENTS

| TW | 201324717 | 6/2013 |
| TW | 201639093 | 11/2016 |
| TW | 201903996 | 1/2019 |

OTHER PUBLICATIONS

"Office Action of Taiwan Counterpart Application", dated Nov. 27, 2020, p. 1-p. 10.

*Primary Examiner* — Luan C Thai
(74) *Attorney, Agent, or Firm* — JCIPRNET

(57) ABSTRACT

A package structure includes a circuit substrate and a semiconductor package. The semiconductor package is disposed on the circuit substrate, and includes a plurality of semiconductor dies, an insulating encapsulant and a connection structure. The insulating encapsulant comprises a first portion and a second portion protruding from the first portion, the first portion is encapsulating the plurality of semiconductor dies and has a planar first surface, and the second portion has a planar second surface located at a different level than the planar first surface. The connection structure is located over the first portion of the insulating encapsulant on the planar first surface, and located on the plurality of semiconductor dies, wherein the connection structure is electrically connected to the plurality of semiconductor dies and the circuit substrate.

20 Claims, 27 Drawing Sheets

(51) Int. Cl.
*H01L 23/31* (2006.01)
*H01L 23/538* (2006.01)
*H01L 21/48* (2006.01)
*H01L 21/56* (2006.01)
*H01L 21/78* (2006.01)

(52) U.S. Cl.
CPC ............ *H01L 21/565* (2013.01); *H01L 21/78* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 2224/214* (2013.01); *H01L 2924/35121* (2013.01)

(58) Field of Classification Search
CPC ............ H01L 23/3128; H01L 23/5383; H01L 23/5386; H01L 23/5389; H01L 24/19; H01L 24/20
USPC ........................................................ 257/668
See application file for complete search history.

(56) References Cited

U.S. PATENT DOCUMENTS

| | | | |
|---|---|---|---|
| 8,409,920 B2* | 4/2013 | Pendse | H01L 25/03 |
| | | | 438/109 |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |

* cited by examiner

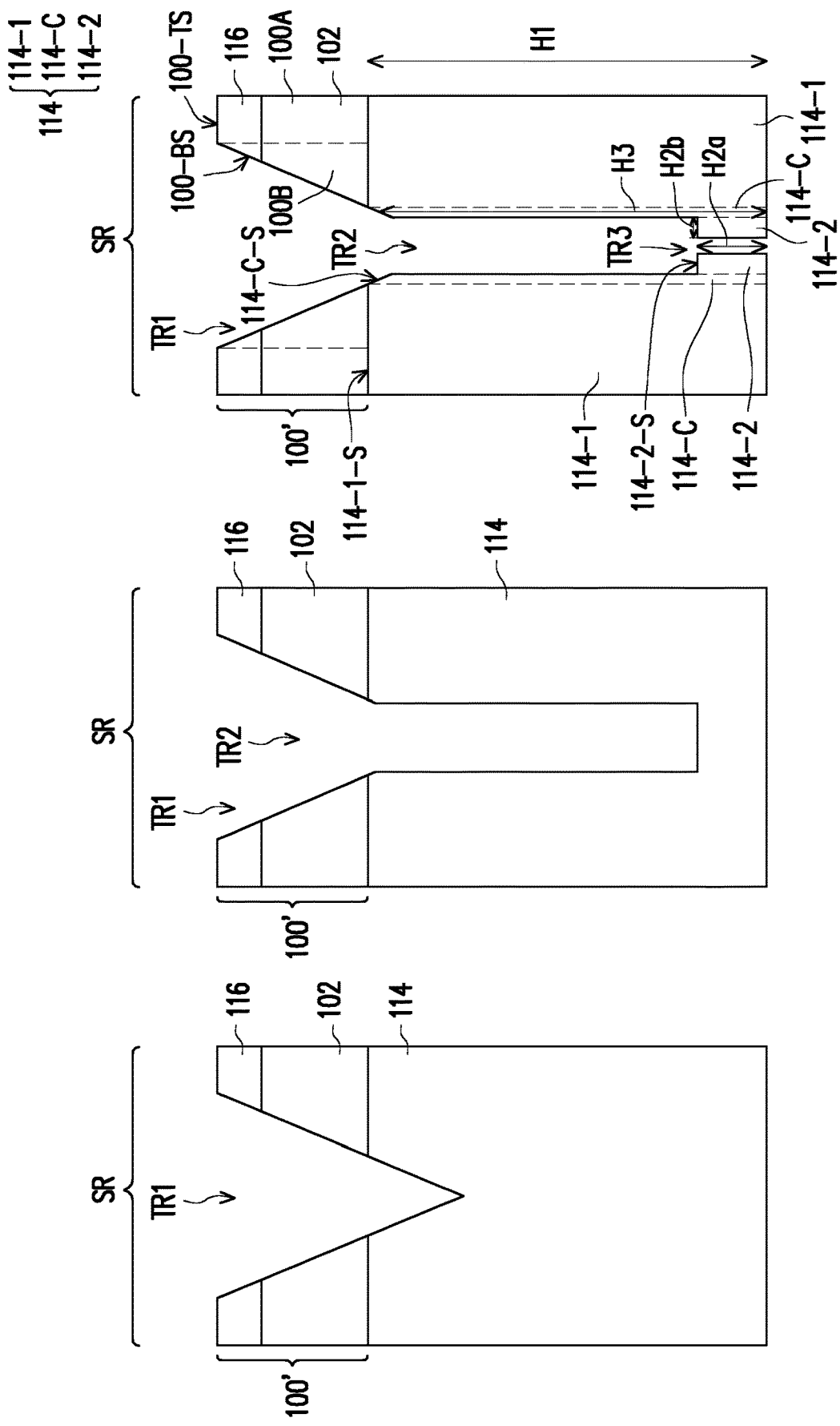

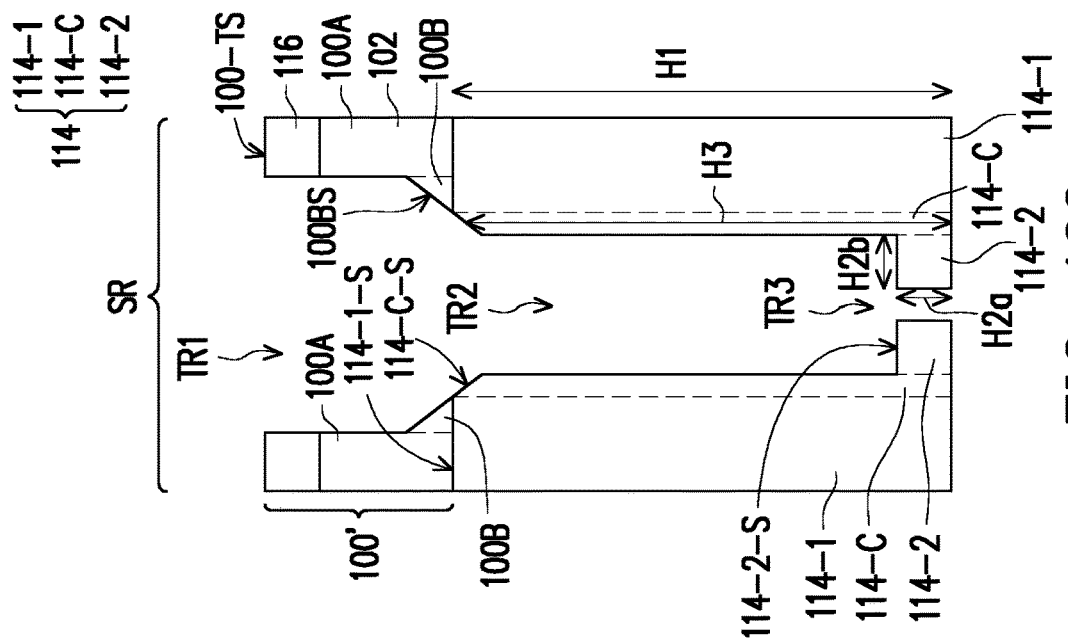
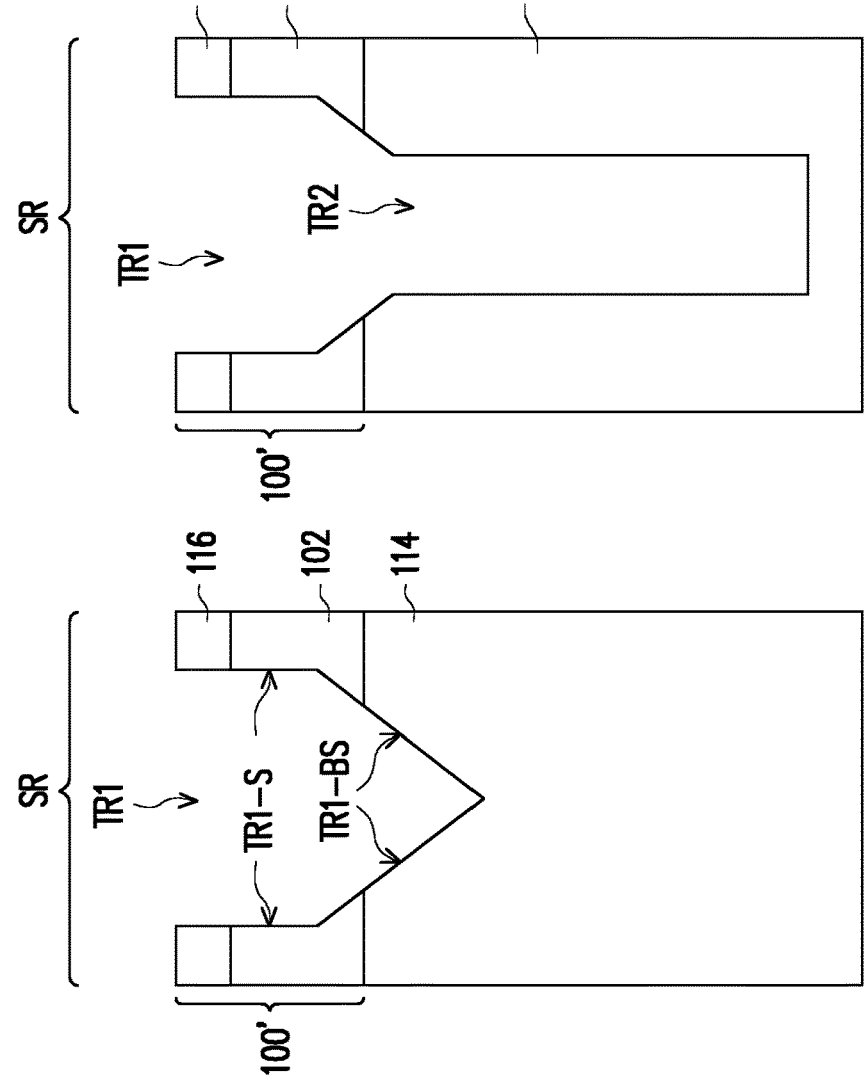
FIG. 10A   FIG. 10B   FIG. 10C

PACKAGE STRUCTURE AND METHOD OF FABRICATING THE SAME

CROSS-REFERENCE TO RELATED APPLICATION

This application claims the priority benefit of U.S. provisional application Ser. No. 62/892,554, filed on Aug. 28, 2019. The entirety of the above-mentioned patent application is hereby incorporated by reference herein and made a part of this specification.

BACKGROUND

In advanced assembly design, the semiconductor packages and the multi-chip packages are further connected with circuit substrates through surface mounting technology or flip bonding technology. As the packages are surface mounted to the substrate and further protected with underfills, the reliability of the underfill protection becomes crucial.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 8A to FIG. 8C are enlarged sectional views of a sub region in a method of fabricating a semiconductor package according to some other exemplary embodiments of the present disclosure.

FIG. 10A to FIG. 10C are enlarged sectional views of a sub region in a method of fabricating a semiconductor package according to some other exemplary embodiments of the present disclosure.

DETAILED DESCRIPTION

Figure 1A:
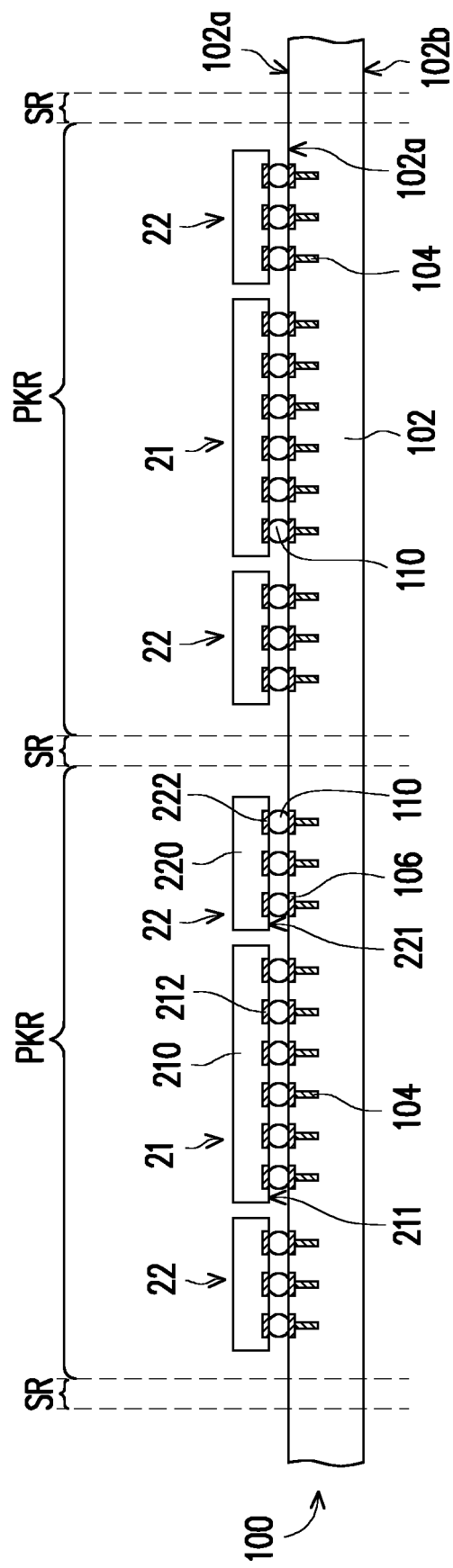
FIG. 1A to FIG. 1I are schematic sectional views of various stages in a method of fabricating a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1I are schematic sectional views of various stages in a method of fabricating a semiconductor package according to some exemplary embodiments of the present disclosure. Referring to FIG. 1A, an interposer structure 100 (or connection structure) is provided. In some embodiments, the interposer structure 100 (or connection structure) includes a core portion 102, and a plurality of through vias 104 and conductive pads 106 formed therein. In some embodiments, the core portion 102 may be a substrate such as a bulk semiconductor substrate, SOI (silicon on insulator) substrate or a multi-layered semiconductor material substrate. The semiconductor material of the substrate (core portion 102) may be silicon, germanium, silicon germanium, silicon carbide, gallium arsenic, gallium phosphide, indium phosphide, indium arsenide, indium antimonide, GaAsP, AlInAs, AlGaAs, GaInAs, GaInP, GaInAsP, or combinations thereof. In some embodiments, the core portion 102 may be doped or undoped.

In some embodiments, the conductive pads 106 are formed on a first surface 102a of the core portion 102. In some embodiments, through vias 104 are formed in the core portion 102 and connected with the conductive pads 106. In some embodiments, the through vias 104 extend into the core portion 102 with a specific depth. In some embodiments, the through vias 104 are through-substrate vias. In some embodiments, the through vias 104 are through-silicon vias when the core portion 102 is a silicon substrate. In some embodiments, the through vias 104 may be formed by forming holes or recesses in the core portion 102 and then filling the recesses with a conductive material. In some embodiments, the recesses may be formed by, for example, etching, milling, laser drilling or the like. In some embodiments, the conductive material may be formed by an electrochemical plating process, CVD (chemical vapor deposition), ALD (atomic layer deposition) or PVD (physical vapor deposition), and the conductive material may include copper, tungsten, aluminum, silver, gold or a combination thereof. In some embodiments, the conductive pads 106 connected with the through vias 104 may be formed as conductive parts of the redistribution layer(s) formed on the interposer structure 100. In some embodiments, the conductive pads 106 include under bump metallurgies (UBMs). In certain embodiments, the interposer structure 100 may further include active or passive devices, such as transistors, capacitors, resistors, or diodes passive devices formed in the core portion 102.

As illustrated in FIG. 1A, the core portion has a plurality of package regions PKR (or main regions) and a sub region SR separating each of the plurality of package regions PKR. The through vias 104 and conductive pads 106 are formed in the core portion 102 within the package regions PKR. In some embodiments, the semiconductor dies 21 and semiconductor dies 22 are provided on the interposer structure 100, or on the core portion 102 within the package regions PKR. The semiconductor dies 21 and semiconductor dies 22 are individual dies singulated from a wafer. In some embodiments, the semiconductor dies 21 contain the same circuitry, such as devices and metallization patterns, or the semiconductor dies 21 are the same type of dies. In some embodiments, the semiconductor dies 22 contain the same circuitry, or the semiconductor dies 22 are the same type of dies. In certain embodiments, the semiconductor dies 21 and the semiconductor dies 22 have different circuitry or are different types of dies. In alternative embodiments, the semiconductor dies 21 and the semiconductor dies 22 may have the same circuitry.

In some embodiments, the semiconductor dies 21 may be major dies, while the semiconductor dies 22 are tributary dies. In some embodiments, the major dies are arranged on the core portion 102 in central locations of each package region PKR, while tributary dies are arranged side-by-side and spaced apart from the major dies. In some embodiments, the tributary dies are arranged aside the major dies, and around or surrounding the major dies. In one embodiment, four or six tributary dies are arranged around one major die per one package region PKR.

In certain embodiments, the semiconductor dies 21 have a surface area larger than that of the semiconductor dies 22. Also, in some embodiments, the semiconductor dies 21 and the semiconductor dies 22 may be of different sizes, including different surface areas and/or different thicknesses. In some embodiments, the semiconductor dies 21 may be a logic die, including a central processing unit (CPU) die, graphics processing unit (GPU) die, system-on-a-chip (SoC) die, a microcontroller or the like. In some embodiments, the semiconductor die 21 is a power management die, such as a power management integrated circuit (PMIC) die. In some embodiments, the semiconductor dies 22 may be a memory die, including dynamic random access memory (DRAM) die, static random access memory (SRAM) die or a high bandwidth memory (HBM) die. The disclosure is not limited thereto, and the number, sizes and types of the semiconductor die disposed on the core portion 102 may be appropriately adjusted based on product requirement.

In the illustrated embodiment, the semiconductor dies 21 include a body 210 and connecting pads 212 formed on an active surface 211 of the body 210. In certain embodiments, the connecting pads 212 may further include pillar structures for bonding the semiconductor dies 21 to other structures. In some embodiments, the semiconductor dies 22 include a body 220 and connecting pads 222 formed on an active surface 221 of the body 220. In other embodiments, the connecting pads 222 may further include pillar structures for bonding the dies 22 to other structures.

In some embodiments, the semiconductor dies 21 and the semiconductor dies 22 are attached to the first surface 102a of the core portion 102, for example, through flip-chip bonding by way of the electrical connectors 110. Through the reflow process, the electrical connectors 110 are formed between the connecting pads 212, 222 and conductive pads 106, electrically and physically connecting the semiconductor dies 21, 22 to the core portion 102 of the interposer structure 100. In some embodiments, the electrical connectors 110 are located in between the semiconductor dies 21, 22 and the interposer structure 100 (or connection structure). In certain embodiments, semiconductor dies 21, 22 are electrically connected to the through vias 104 and the conductive pads 106 through the electrical connectors 110. In one embodiment, the electrical connectors 110 are micro-bumps, such as micro-bumps having copper metal pillars. In another embodiment, the electrical connectors 110 are solder bumps, lead-free solder bumps, or micro bumps, such as controlled collapse chip connection (C4) bumps or micro bumps containing copper pillars. In some embodiments, the bonding between the semiconductor dies 21, 22 and the core portion 102 may be solder bonding. In some embodiments, the bonding between the semiconductor dies 21, 22 and the core portion 102 may be direct metal-to-metal bonding, such as copper-to-copper bonding.

Figure 1B:
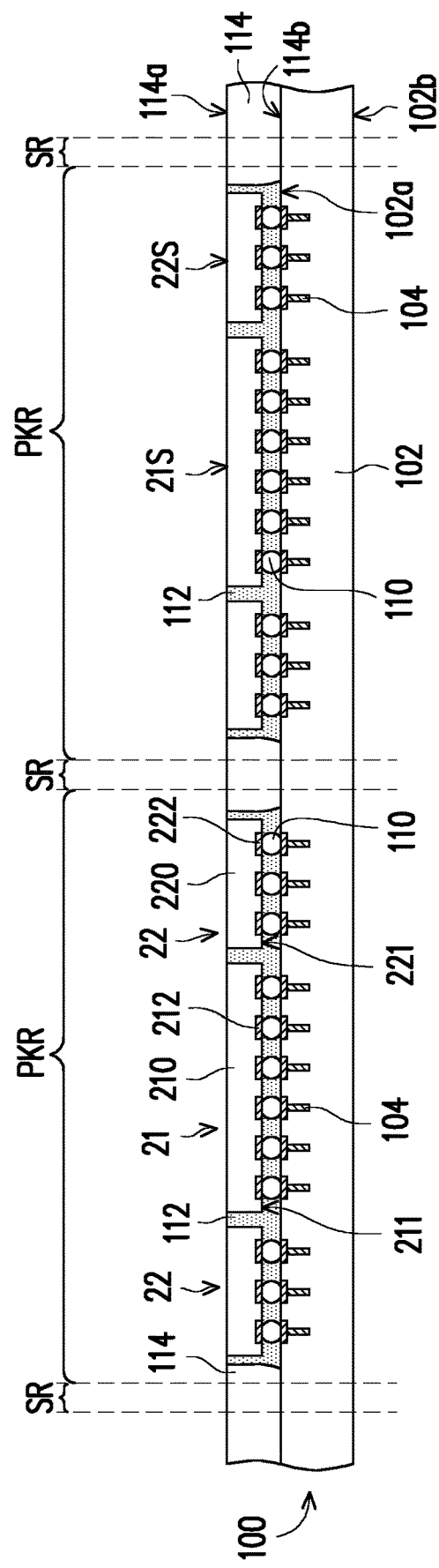

Referring to FIG. 1B, in a next step, a first underfill 112 may be formed to cover the plurality of electrical connectors 110, and to fill in the spaces between the semiconductor dies 21, 22 and the interposer structure 100. In some embodiments, the first underfill 112 further cover side walls of the semiconductor dies 21, 22, and is located within the package region PKR. Thereafter, an insulating encapsulant 114 may be formed over the interposer structure 100 (or over the core portion 102) to cover the first underfill 112, and to surround the semiconductor dies 21 and 22.

In some embodiments, the insulating encapsulant 114 is formed on the first surface 102a of the core portion 102 in the package regions PKR and the sub region SR. In some embodiments, the insulating encapsulant 114 is formed through, for example, a compression molding process or transfer molding. In one embodiment, a curing process is performed to cure the insulating encapsulant 114. In some embodiments, the semiconductor dies 21, 22 and the electrical connectors 110 are encapsulated by the insulating encapsulant 114. In some embodiments, a planarization process, including grinding or polishing, may be performed to partially remove the insulating encapsulant 114, exposing backside surfaces 21S, 22S of the semiconductor dies 21, 22. Accordingly, the backside surfaces 21S, 22S of the semiconductor dies 21, 22 are levelled with a top surface 114a of the insulating encapsulant 114. The top surface 114a being opposite to a backside surface 114b of the insulating encapsulant 114, wherein the backside surface 114b is in contact with the core portion 102.

In some embodiments, a material of the insulating encapsulant 114 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating encapsulant 114 may include an acceptable insulating encapsulation material. In some embodiments, the insulating encapsulant 114 may further include inorganic filler or inorganic compound (e.g. silica, clay, and so on) which can be added therein to optimize coefficient of thermal expansion (CTE) of the insulating encapsulant 114. The disclosure is not limited thereto.

Figure 1C:
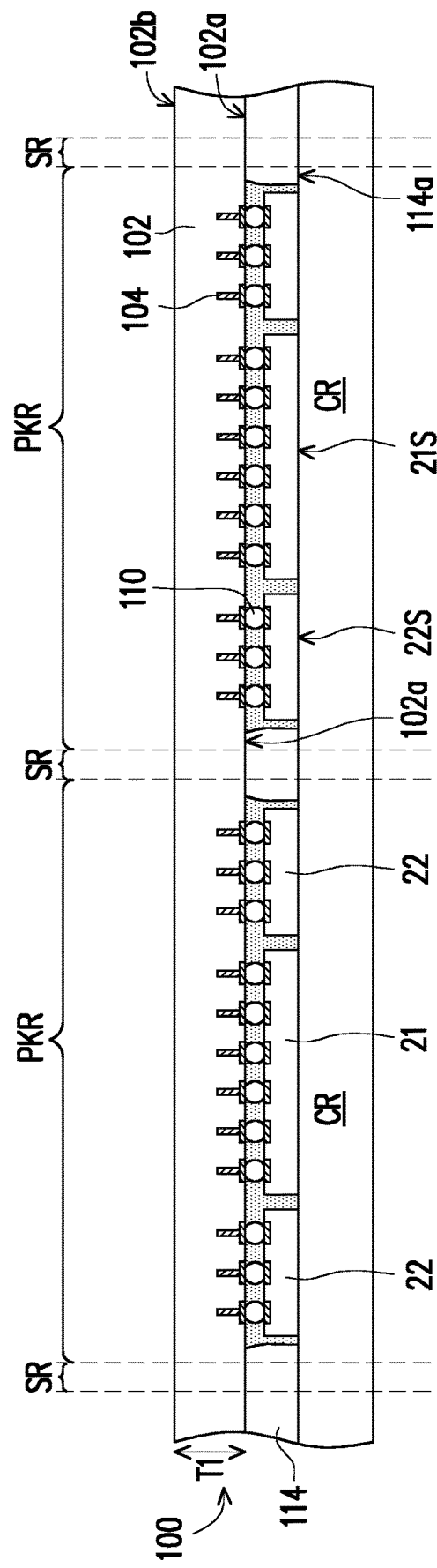

Referring to FIG. 1C, the structure of FIG. 1B is turned upside down or flipped, and placed on a carrier CR, so that the carrier CR directly contacts the backside surfaces 21S, 22S of the semiconductor dies 21, 22 and the top surface 114a of the insulating encapsulant 114. As shown in FIG. 1C, at this stage of processing, the interposer structure 100 has not been thinned and has a thickness T1. In other words, the through vias 104 are not revealed, and are embedded in the core portion 102 of the interposer structure 100.

Figure 1D:
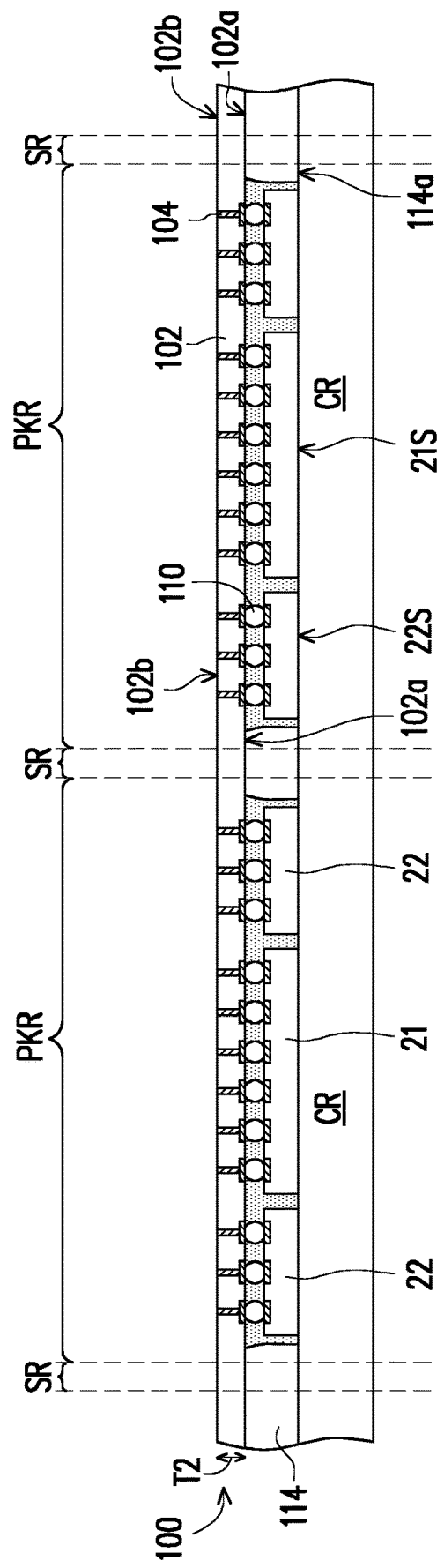

Referring to FIG. 1D, a thinning process is performed to the interposer 100 to partially remove or thin the core portion 102 of the interposer structure 100 until the through vias 104 are exposed and a second surface 102b of the core portion 102 is formed. In some embodiments, the thinning process may include a back-grinding process, a polishing process or an etching process. In some embodiments, after the thinning process, the interposer structure 100 is thinned to a thickness T2. In some embodiments, a ratio of the thickness T2 to the thickness T1 ranges from about 0.1 to about 0.5.

Figure 1E:
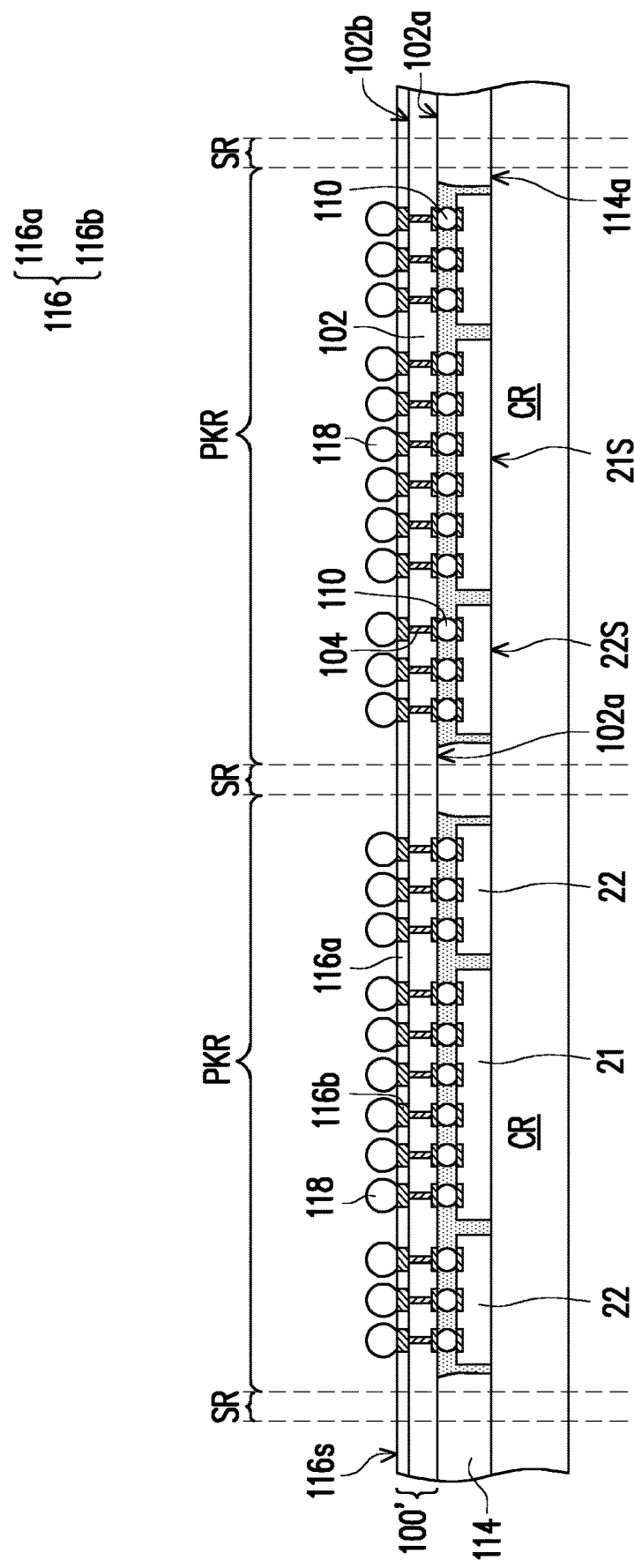

Referring to FIG. 1E, a redistribution structure 116 is formed on the second surface 102b of the core portion 102 in the package region PKR and the sub region SR. The second surface 102b being opposite to the first surface 102a of the core portion 102. In some embodiments, the redistribution structure 116, the core portion 102, the through vias 104 and conductive pads 106 constitutes the interposer structure 100'. In some embodiments, the redistribution structure 116 electrically connects the through vias 104 and/or electrically connects the through vias 104 with external devices. In certain embodiments, the redistribution structure 116 includes at least one dielectric layer 116a and metallization patterns 116b in the dielectric layer 116a. In some embodiments, the metallization patterns 116b may comprise pads, vias and/or trace lines to interconnect the through vias 104 and to further connect the through vias 104 to one or more external devices. Although one layer of dielectric layer 116a, and one layer of the metallization patterns 116b is shown in FIG. 1E, it should be noted that the number of layers of the dielectric layer 116a and the metallization patterns 116b is not limited thereto, and could be adjusted based on requirement.

In some embodiments, the material of the dielectric layer 116a comprises silicon oxide, silicon nitride, silicon carbide, silicon oxynitride, or low-K dielectric materials (such as phosphosilicate glass materials, fluorosilicate glass materials, boro-phosphosilicate glass materials, SiOC, spin-on-glass materials, spin-on-polymers or silicon carbon materials). In some embodiments, the dielectric layer 116a may be formed by spin-coating or deposition, including chemical vapor deposition (CVD), plasma enhanced chemical vapor deposition (PECVD), high-density plasma chemical vapor deposition (HDP-CVD), or the like. In some embodiments, the metallization patterns 116b include under-metal metallurgies (UBMs). In some embodiments, the formation of the metallization patterns 116b may include patterning the dielectric layer using photolithography techniques and one or more etching processes and filling a metallic material into the openings of the patterned dielectric layer. Any excessive conductive material on the dielectric layer may be removed, such as by using a chemical mechanical polishing process. In some embodiments, the material of the metallization patterns 116b includes copper, aluminum, tungsten, silver, and combinations thereof.

As illustrated in FIG. 1E, a plurality of conductive terminals 118 is disposed on the metallization patterns 116b, and is electrically coupled to the through vias 104. In some embodiments, the conductive terminals 118 are placed on the top surface 116s of the redistribution structure 116, and electrically connected to the through vias 104 by the metallization patterns 116b within the package region PKR. In certain embodiments, the conductive terminals 118 are positioned on and physically attached to the metallization patterns 116b. In some embodiments, the conductive terminals 118 include lead-free solder balls, solder balls, ball grid array (BGA) balls, bumps, C4 bumps or micro bumps. In some embodiments, the conductive terminals 118 may include a conductive material such as solder, copper, aluminum, gold, nickel, silver, palladium, tin, or a combination thereof. In some embodiments, the conductive terminals 118 are formed by forming the solder paste on the redistribution structure 116 by, for example, evaporation, electroplating, printing or solder transfer and then reflowed into the desired bump shapes. In some embodiments, the conductive terminals 118 are placed on the redistribution structure 116 by ball placement or the like. In other embodiments, the conductive terminals 118 are formed by forming solder-free metal pillars (such as a copper pillar) by sputtering, printing, electroless or electro plating or CVD, and then forming a lead-free cap layer by plating on the metal pillars. The conductive terminals 118 may be used to bond to an external device or an additional electrical component. In some embodiments, the conductive terminals 118 are used to bond to a circuit substrate, a semiconductor substrate or a packaging substrate.

Figure 1F:
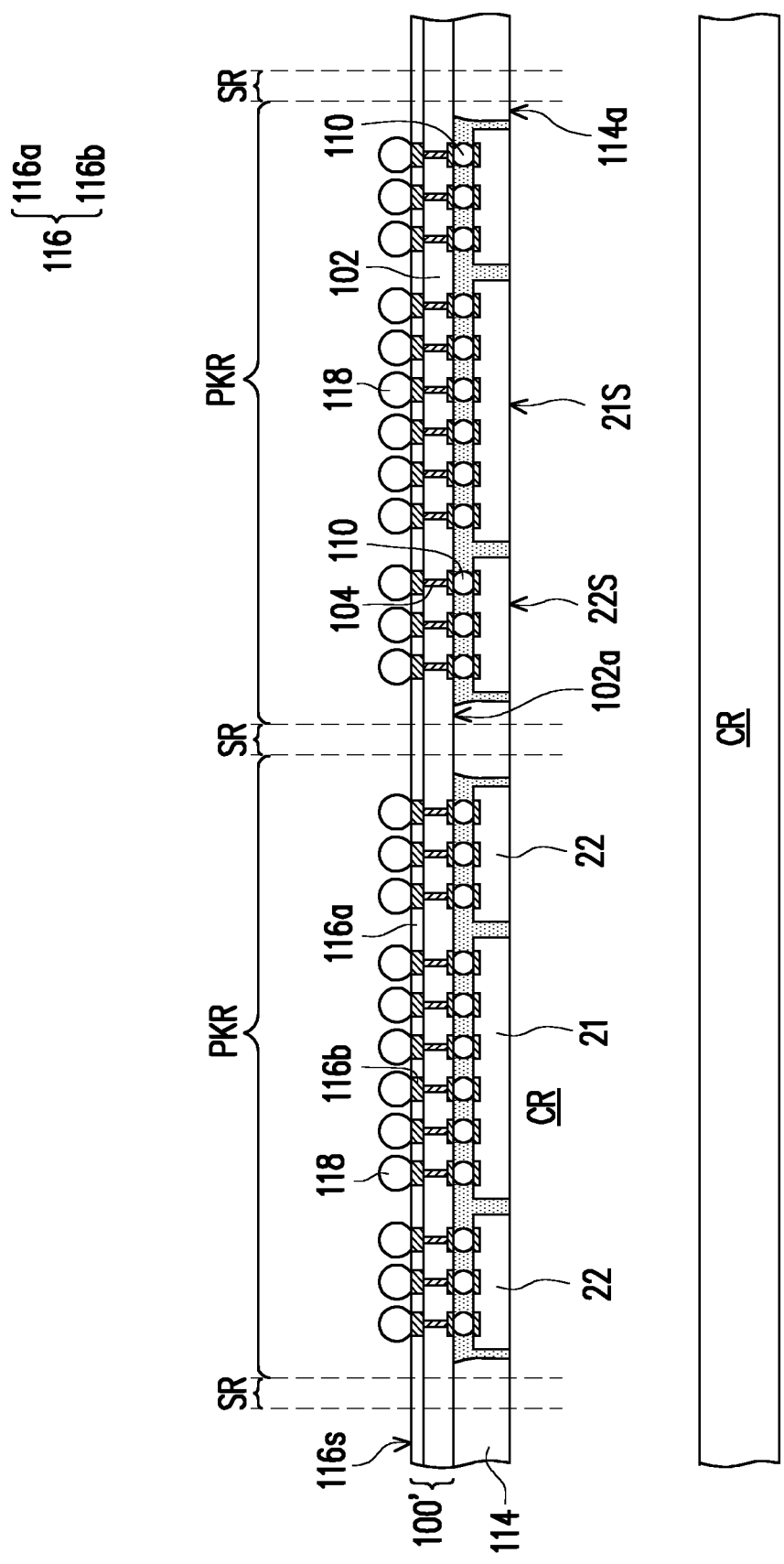
Figure 1G:
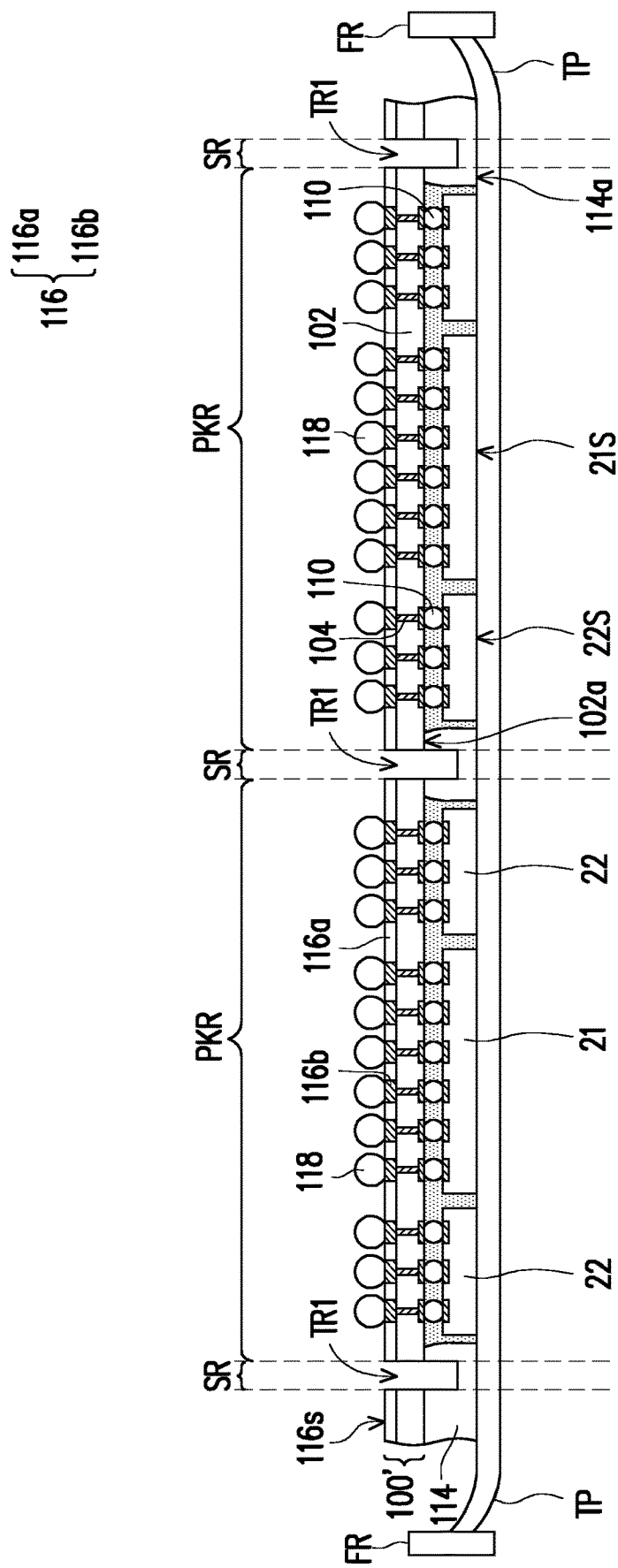

As illustrated in FIG. 1F, in a subsequent step, the carrier CR is de-bonded. For example, the de-bonding process includes projecting a light such as a laser light or an UV light on a debond layer (e.g., light-to-heat-conversion release layer) that is attached to the carrier CR (not shown), so that the carrier CR can be easily removed along with the debond layer. As illustrated in FIG. 1G, after de-bonding the carrier CR, the structure shown in FIG. 1F is attached to a tape TP (e.g., a dicing tape) supported by a frame FR. Thereafter, a first sawing process is performed to remove portions of the interposer structure 100' and portions of the insulating encapsulant 114 in the sub region SR to form a first trench TR1. In some embodiments, the first trench TR1 surrounds the package region PKR. In some embodiments, the first sawing process is performed to saw through the interposer structure 100' by removing the dielectric layer 116a and the core portion 102 of the interposer structure 100' in the sub region SR. In certain embodiments, the first sawing process is performed to remove a portion of the insulating encapsulant 114 in the sub region SR, while another portion of the insulating encapsulant 114 is retained in the sub region SR.

Figure 1H:
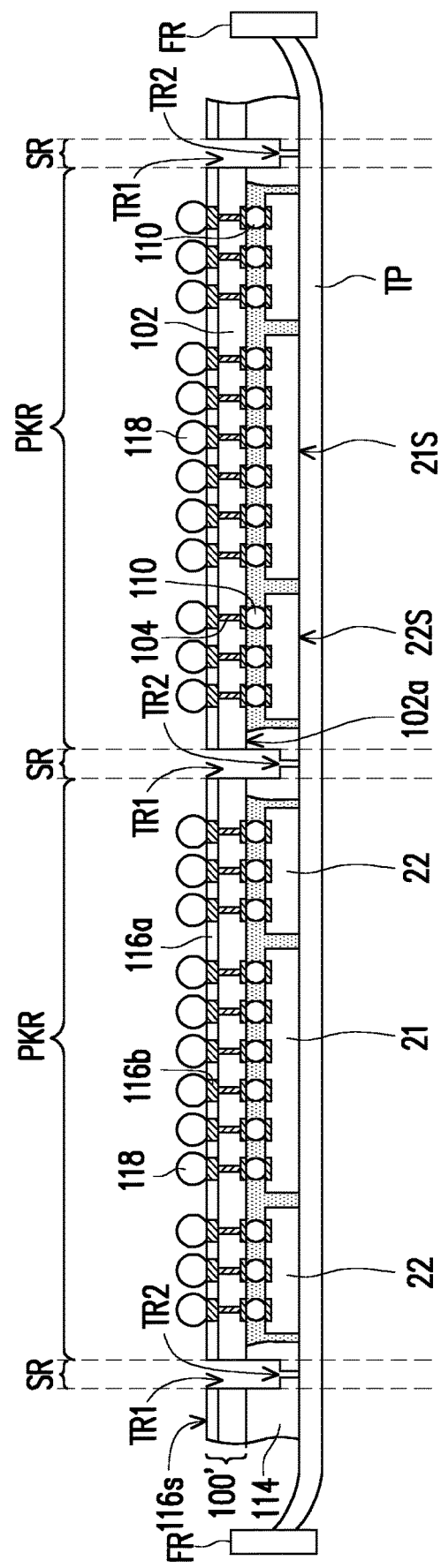

As illustrated in FIG. 1H, in a next step, a second sawing process is performed in the first trench TR1 by sawing through the insulating encapsulant 114 in the sub region SR. In some embodiments, the second sawing process is performed to form a second trench TR2 through the first trench TR1, whereas the second trench TR2 reveals a surface of the tape TP. In certain embodiments, the second trench TR2 overlaps with the first trench TR1, and a width of the second trench TR2 is smaller than a width of the first trench TR1. Furthermore, in some embodiments, the second sawing process is performed to separate the plurality of package regions PKR from another. After performing the sawing processes, a semiconductor package SM (corresponding to the components in the package region PKR) illustrated in FIG. 1I can be obtained.

Although sawing processes are referred in the exemplary embodiment and throughout the disclosure, it should be noted that the means of removing the insulating encapsulant 114 and/or interposer structure 100' is not limited thereto. For example, in alternative embodiments, laser drilling, etching or the like may be performed to remove the insulating encapsulant 114 and/or interposer structure 100' to form the trenches.

Figure 1I:
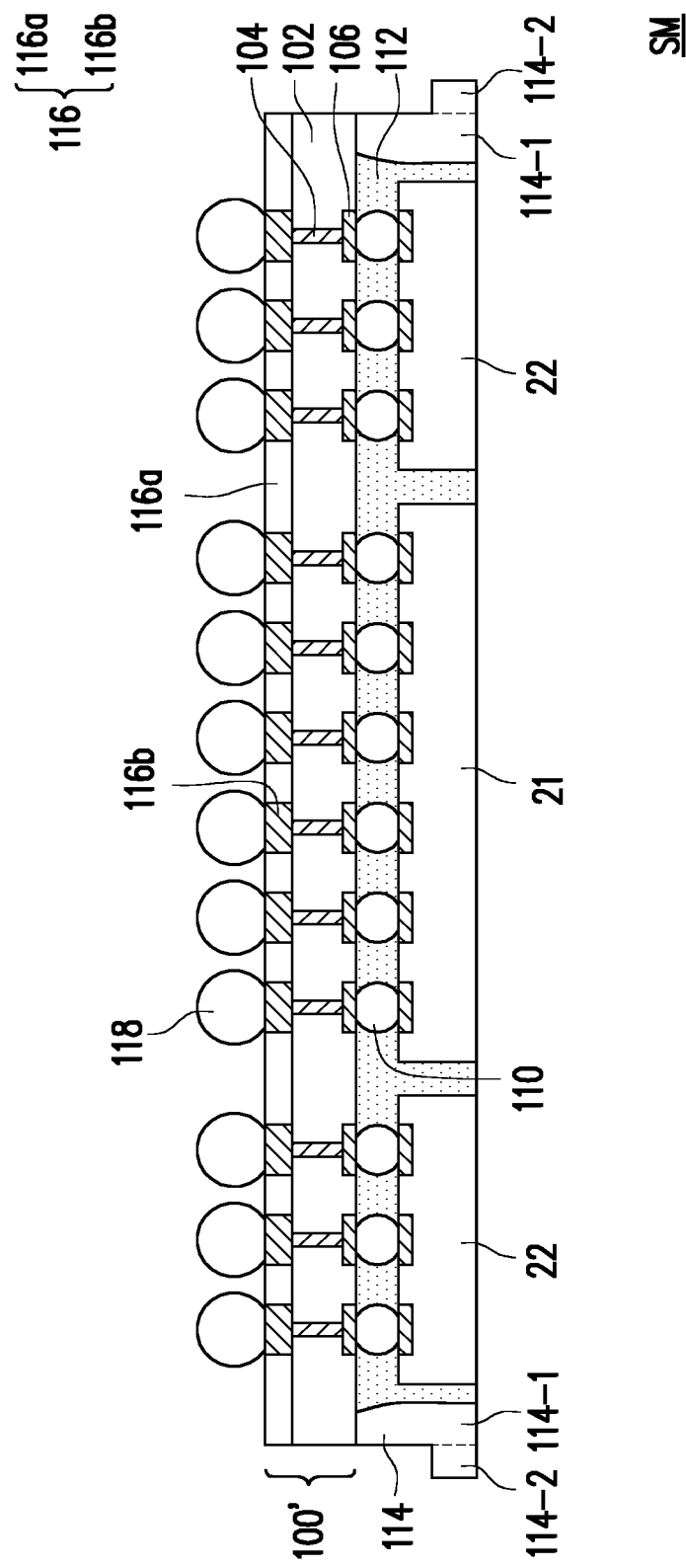
Figure 2B:
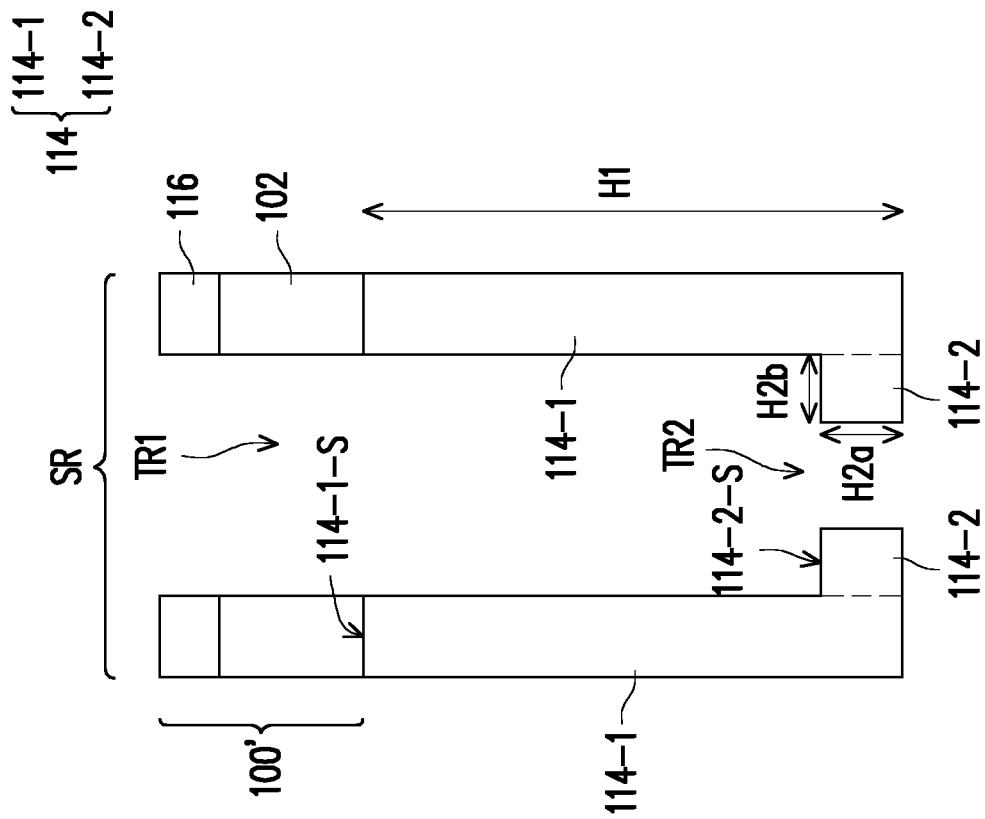
FIG. 2A and FIG. 2B are enlarged sectional views of a sub region in a method of fabricating a semiconductor package according to some exemplary embodiments of the present disclosure.
Figure 2A:
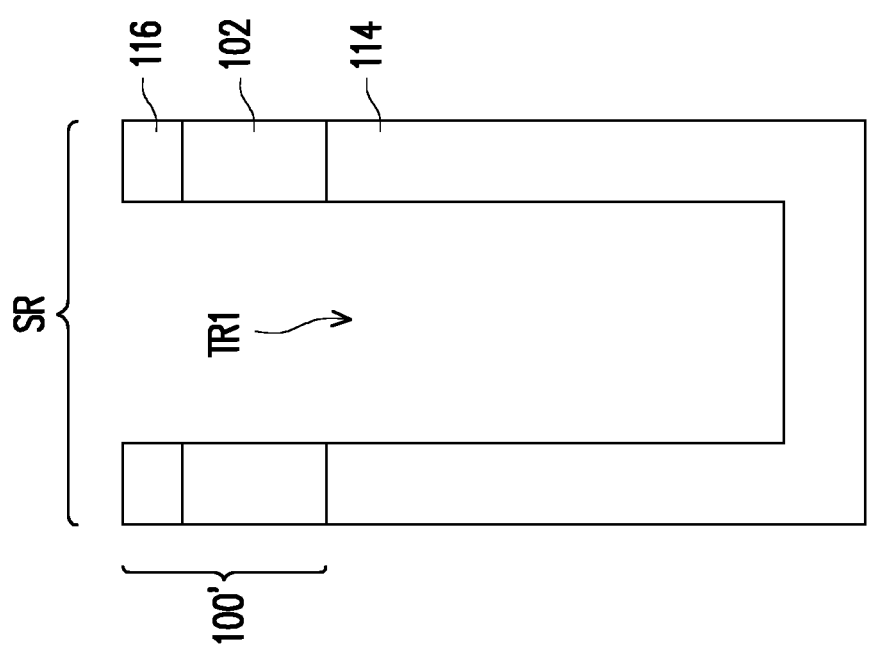

FIG. 2A and FIG. 2B are enlarged sectional views of a sub region SR in a method of fabricating the semiconductor package SM according to FIG. 1A to FIG. 1I. Referring to FIG. 2A, in some embodiments, the first sawing process completely saws through the interposer structure 100' to remove the redistribution structure 116 and the core portion 102, while a portion of the insulating encapsulant 114 is removed to define the first trench TR1. Referring to FIG. 2B and FIG. 1I, after performing the second sawing process to define the second trench TR2, a plurality of semiconductor packages SM having an insulating encapsulant 114 with a protruding structure (protruded second portion 114-2) can be obtained.

For example, in the exemplary embodiment, after the sawing processes, the insulating encapsulant 114 is formed to include a first portion 114-1 and a second portion 114-2 protruding from the first portion 114-1. In some embodiments, the first portion 114-1 of the insulating encapsulant 114 is encapsulating the semiconductor dies 21 and 22, and has a planar first surface 114-1-S. In certain embodiments, the second portion 114-2 of the insulating encapsulant 114 has a planar second surface 114-2-S located at a different level than the planar first surface 114-1-S. In other words, a step height difference exists between the planar first surface 114-1-S and the planar second surface 114-2-S. In some embodiments, the first portion 114-1 is overlapped with the interposer structure 100', whereas the second portion 114-2 is non-overlapped with the interposer structure 100'.

Furthermore, in some embodiments, a height H1 of the first portion 114-1 of the insulating encapsulant 114 is different than a height H2a of the second portion 114-2 of the insulating encapsulant. For example, the height H1 of the first portion 114-1 is greater than the height H2a of the second portion 114-2. In certain embodiments, the height H2a of the second portion 114-2 is less than half of the height H1 of the first portion 114-1. However, the disclosure is not limited thereto, and the heights of the first portion 114-1 and the second portion 114-2 of the insulating encapsulant 114 may be appropriately adjusted as long as height H1 is greater and different than height H2a. In some embodiments, a ratio (H2a/H2b) of a height H2a of the second portion 114-2 to a width H2b of the second portion 114-2 is in a range of 0.6 to 4. In certain embodiments, the ratio (H2a/H2b) of the height H2a to the width H2b is controlled in the range of 0.6 to 4 so as to reduce a stress located at interfaces between the semiconductor package SM and an underfill structure formed thereafter.

In the above embodiments, the package regions PKR are separated from one another by a first sawing process and a second sawing process to obtain the semiconductor package SM. However, the disclosure is not limited thereto, and various different sawing processes may be performed to separate the package regions PKR from one another to obtain different packages.

Figure 3B:
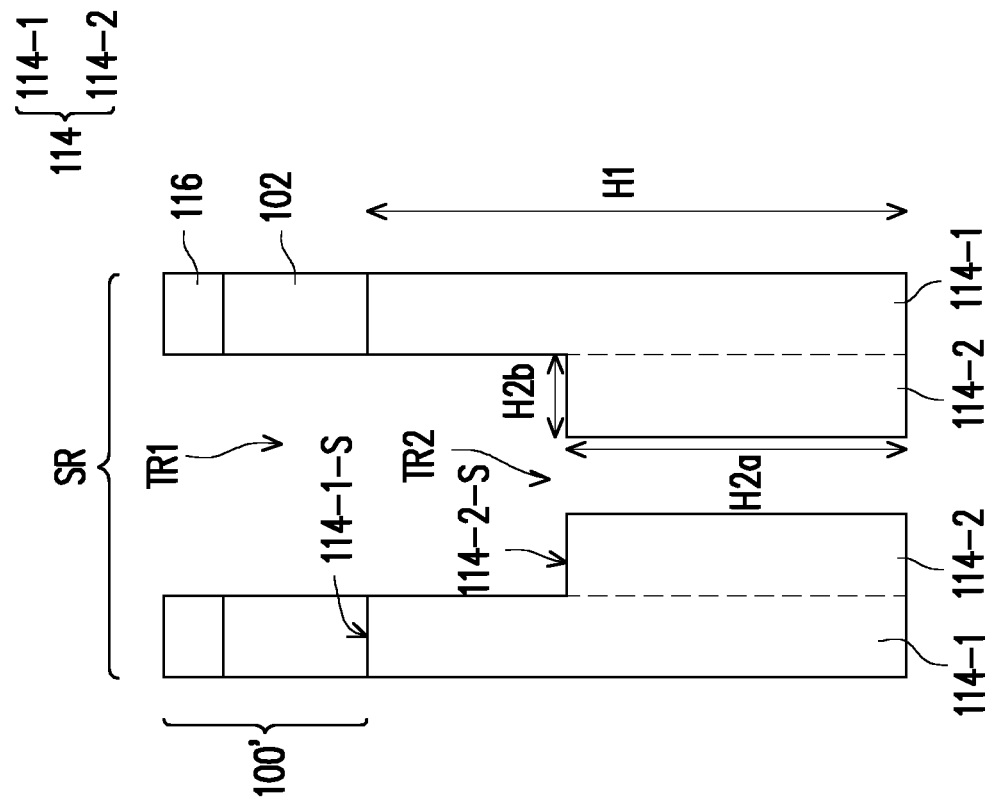
FIG. 3A and FIG. 3B are enlarged sectional views of a sub region in a method of fabricating a semiconductor package according to some other exemplary embodiments of the present disclosure.
Figure 3A:
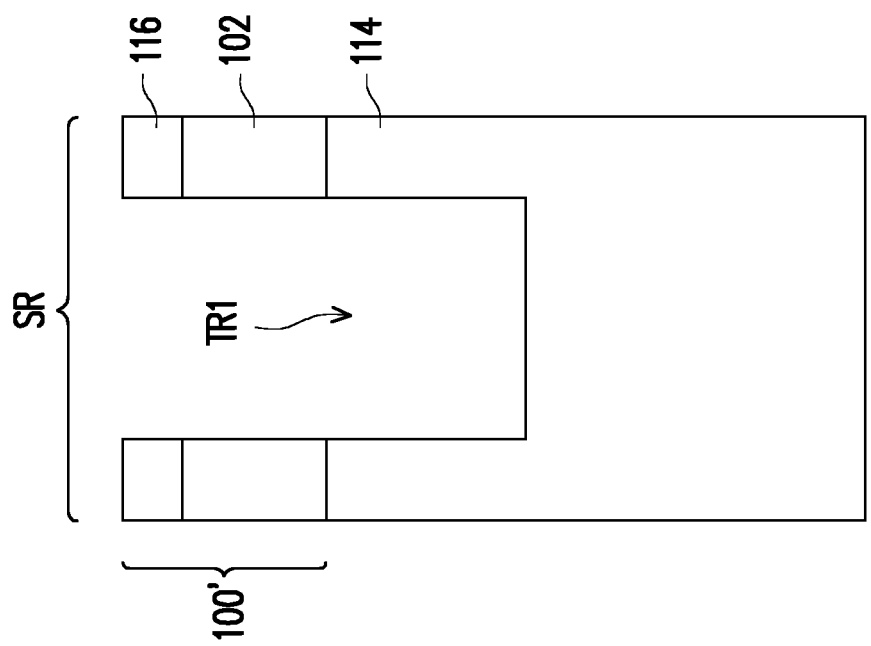

FIG. 3A and FIG. 3B are enlarged sectional views of a sub region in a method of fabricating a semiconductor package according to some other exemplary embodiments of the present disclosure. The method illustrated in FIG. 3A and FIG. 3B is similar to the method illustrated in FIG. 2A and FIG. 2B, hence the same reference numerals may be used to refer to the same or liked parts, and its detailed description will be omitted herein. The difference between the embodiments is in the height H2a and width H2b of the second portion 114-2 of the insulating encapsulant 114.

Referring to FIG. 3A, in the exemplary embodiment, a first sawing process is performed to remove portions of the interposer structure 100' and portions of the insulating encapsulant 114 in the sub region SR to form a first trench TR1. In some embodiments, an amount of the interposer structure 100' and insulating encapsulant 114 removed may define a height H2a of the second portion 114-2 of the insulating encapsulant 114 formed in a subsequent step. Referring to FIG. 3B, in some embodiments, a second sawing process is performed in the first trench TR1 by sawing through the insulating encapsulant 114 in the sub region SR to define a second trench TR2, and to separate the semiconductor packages from one another. In some embodiments, a width of the second trench TR2 may define a width H2b of the second portion 114-2 of the insulating encapsulant 114 formed in a subsequent step. As illustrated in FIG. 3B, the formed insulating encapsulant 114 includes a first portion 114-1 and a second portion 114-2, wherein a height H2a of the second portion 114-2 is smaller than a height H1 of the first portion 114-1, but more than half of the height H1 of the first portion 114-1. Furthermore, the height H2a and width H2b of the insulating encapsulant 114 shown in FIG.

3B are greater than the height H2a and width H2b of the insulating encapsulant 114 shown in FIG. 2B.

Figure 4B:
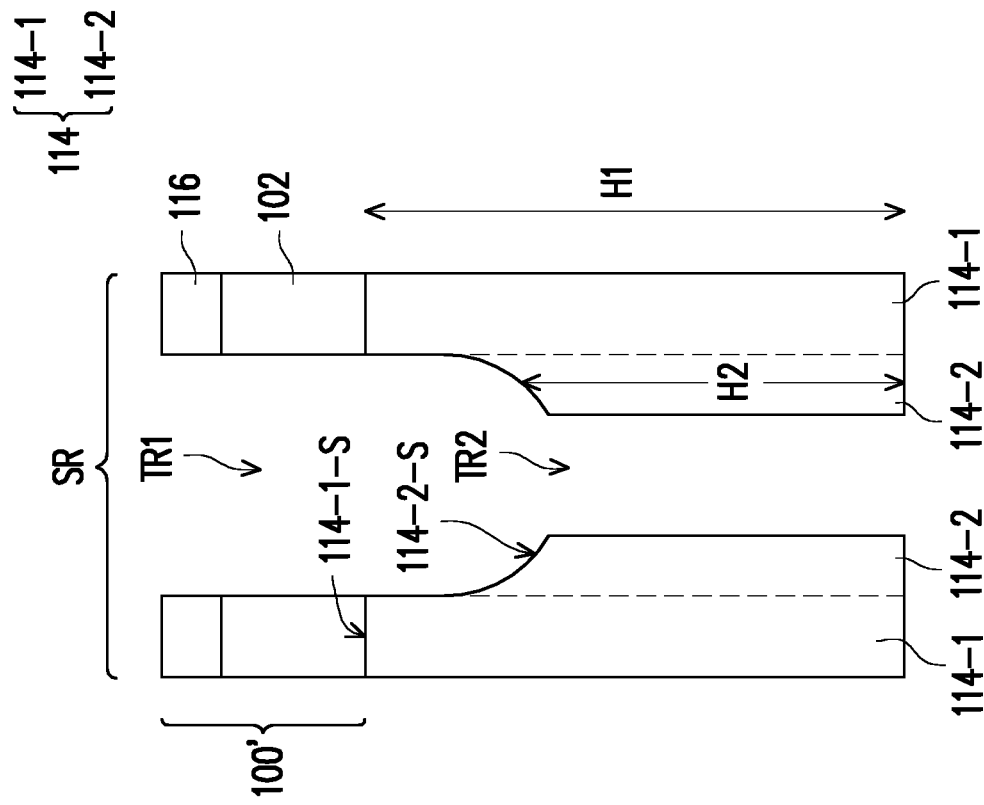
FIG. 4A and FIG. 4B are enlarged sectional views of a sub region in a method of fabricating a semiconductor package according to some other exemplary embodiments of the present disclosure.
Figure 4A:
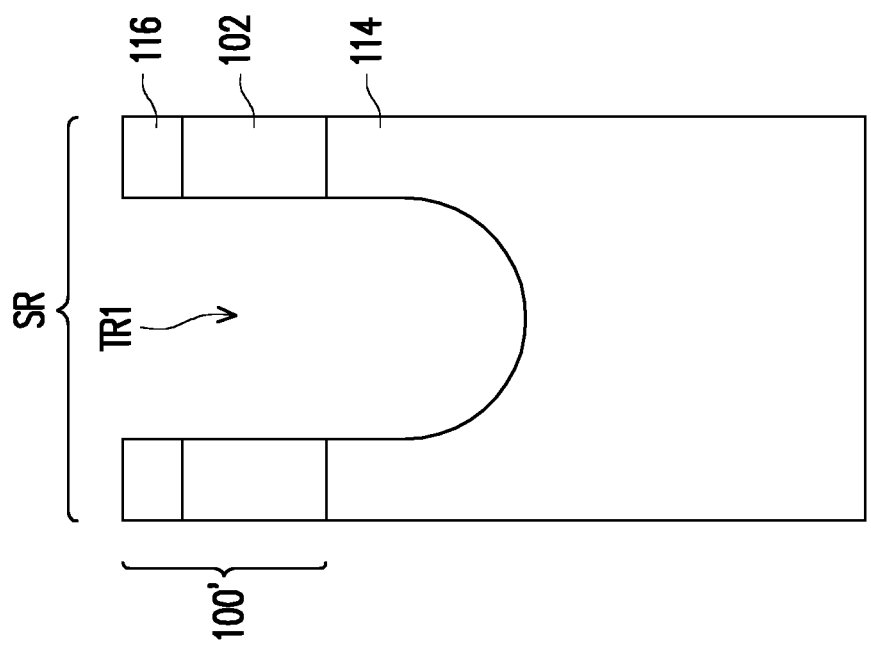

FIG. 4A and FIG. 4B are enlarged sectional views of a sub region in a method of fabricating a semiconductor package according to some other exemplary embodiments of the present disclosure. The method illustrated in FIG. 4A and FIG. 4B is similar to the method illustrated in FIG. 3A and FIG. 3B, hence the same reference numerals may be used to refer to the same or liked parts, and its detailed description will be omitted herein. The difference between the embodiments is in the design of the second portion 114-2 of the insulating encapsulant 114.

Referring to FIG. 3A, the first sawing process is performed to form a first trench TR1 having substantially flat bottom and side surfaces. However, the disclosure is not limited thereto. For example, referring to FIG. 4A, a first sawing process is performed to form a first trench TR1 with curved bottom surfaces. For example, the first trench TR1 has a substantially U-shaped profile when viewed from a cross section. Referring to FIG. 4B, a second sawing process is then performed in the first trench TR1 by sawing through the insulating encapsulant 114 in the sub region SR to define a second trench TR2, and to separate the semiconductor packages from one another. As illustrated in FIG. 4B, the insulating encapsulant 114 is formed with a first portion 114-1 and a second portion 114-2 surrounding the first portion 114-1 (in each of the semiconductor packages). In the exemplary embodiment, the first portion 114-1 of the insulating encapsulant 114 is encapsulating the semiconductor dies (not shown), and has a planar first surface 114-1-S. In certain embodiments, the second portion 114-2 of the insulating encapsulant 114 has a curved top surface 114-2-S that is joined with the planar first surface 114-1-S. Furthermore, a height H1 of the first portion 114-1 of the insulating encapsulant 114 is greater than an average height H2 of the second portion 114-2 of the insulating encapsulant 114.

Figures 5A, 5B, 5C:
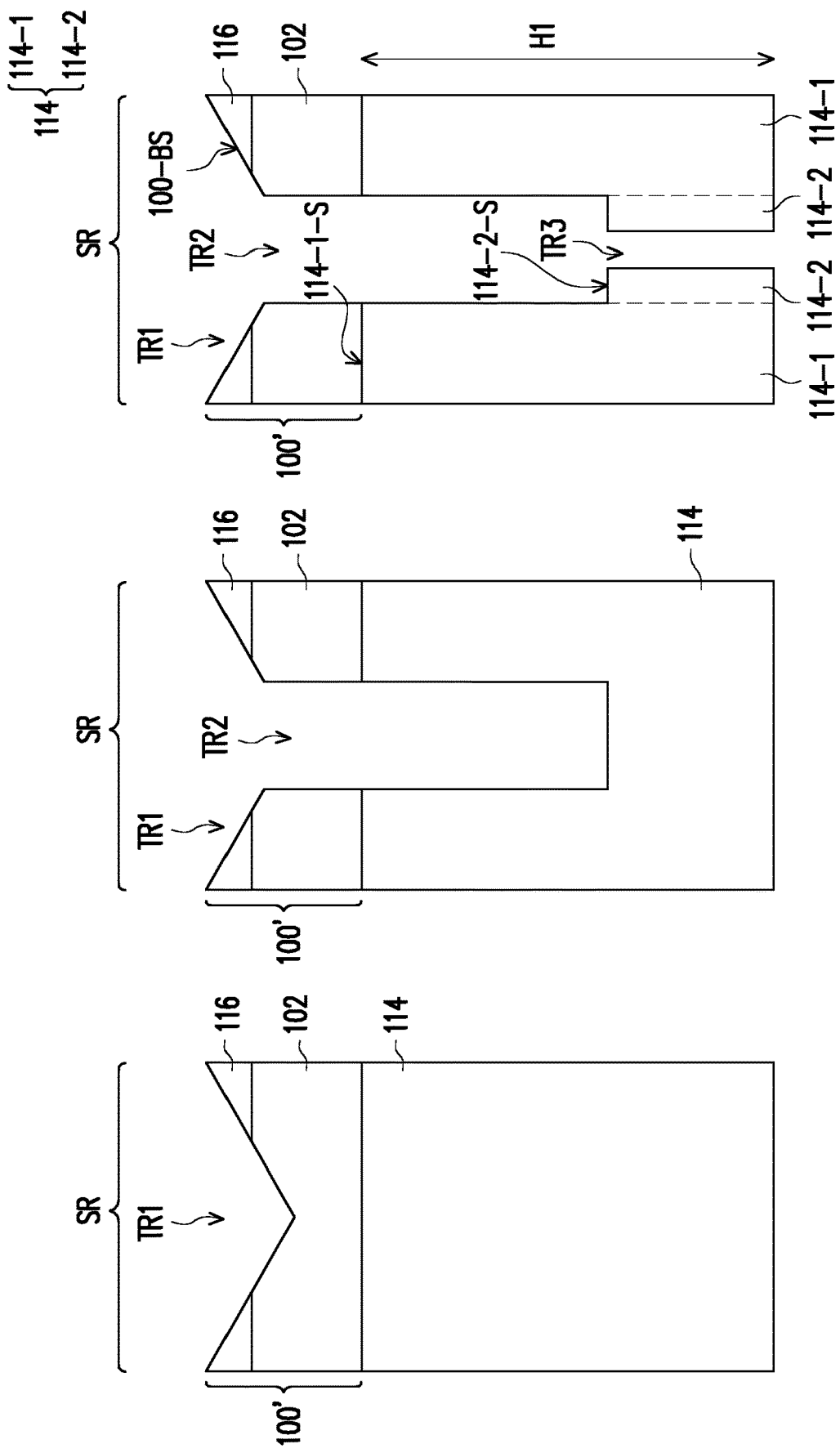
FIG. 5A to FIG. 5C are enlarged sectional views of a sub region in a method of fabricating a semiconductor package according to some other exemplary embodiments of the present disclosure.

FIG. 5A to FIG. 5C are enlarged sectional views of a sub region in a method of fabricating a semiconductor package according to some other exemplary embodiments of the present disclosure. The method illustrated in FIG. 5A to FIG. 5C is similar to the method illustrated in FIG. 3A and FIG. 3B, hence the same reference numerals may be used to refer to the same or liked parts, and its detailed description will be omitted herein. The difference between the embodiments is that a three-step sawing process is performed instead of a two-step sawing process.

As illustrated in FIG. 5A, a first sawing process is performed to remove portions of the interposer structure 100' in the sub region SR to form a beveled first trench TR1. In some embodiments, the first sawing process is performed to remove portions of the redistribution structure 116 and portions of the core portion 102 so that a beveled first trench TR1 having a V-shaped profile (when viewed from a cross section) is defined. The first sawing process shown in FIG. 5A does not cut through the interposer structure 100'. Referring to FIG. 5B, in a next step, a second sawing process is performed in the beveled first trench TR1 to remove portions of the interposer structure 100' and portions of the insulating encapsulant 114 in the sub region SR, and to form a second trench TR2 through the beveled first trench TR1. Subsequently, referring to FIG. 5C, a third sawing process is performed in the second trench TR2 by sawing through the insulating encapsulant 114, and to form a third trench TR3 through the second trench TR2. In the exemplary embodiment, the third sawing process is performed so that the third trench TR3 is defined to reveal the tape (not shown) located underneath.

As shown in FIG. 5C, after the third sawing process, the interposer structure 100' (or connection structure) is formed with beveled surface 100-BS. In some embodiments, the beveled surface 100-BS is defined by the surfaces of the redistribution structure 116 and the core portion 102. For example, a surface of the redistribution structure 116 and a surface of the core portion 102 together form the beveled surface 100-BS of the interposer structure 100'. Furthermore, in the exemplary embodiment, the insulating encapsulant 114 is formed with a first portion 114-1 and a second portion 114-2 surrounding the first portion 114-1 (in each of the semiconductor packages). In some embodiments, the first portion 114-1 of the insulating encapsulant 114 is encapsulating the semiconductor dies (not shown), and has a planar first surface 114-1-S. In certain embodiments, the second portion 114-2 of the insulating encapsulant 114 has a planar second surface 114-2-S located at a different level than the planar first surface 114-1-S. In other words, a step height difference exists between the planar first surface 114-1-S and the planar second surface 114-2-S. In some embodiments, the planar second surface 114-2-S also has a step height difference to the beveled surface 100-BS.

Figure 6C:
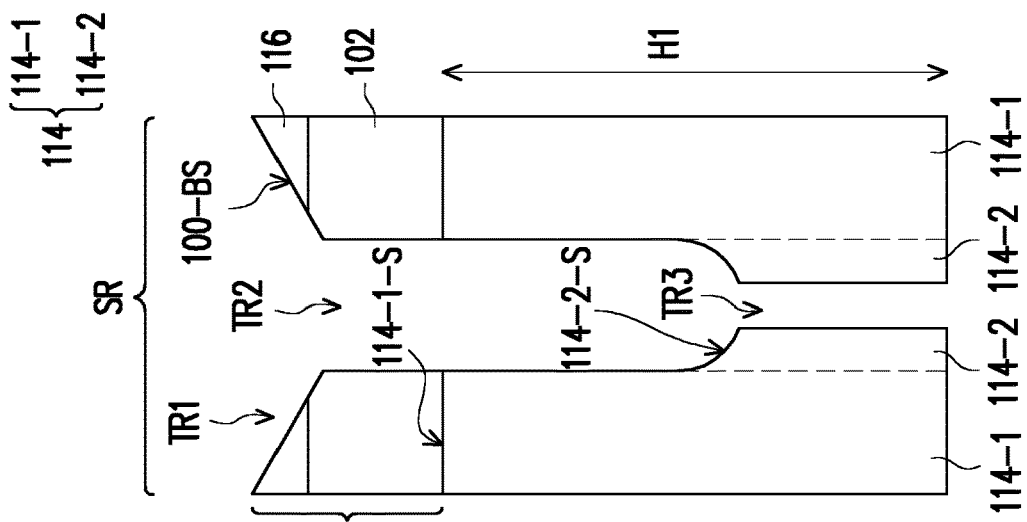
FIG. 6A to FIG. 6C are enlarged sectional views of a sub region in a method of fabricating a semiconductor package according to some other exemplary embodiments of the present disclosure.
Figure 6B:
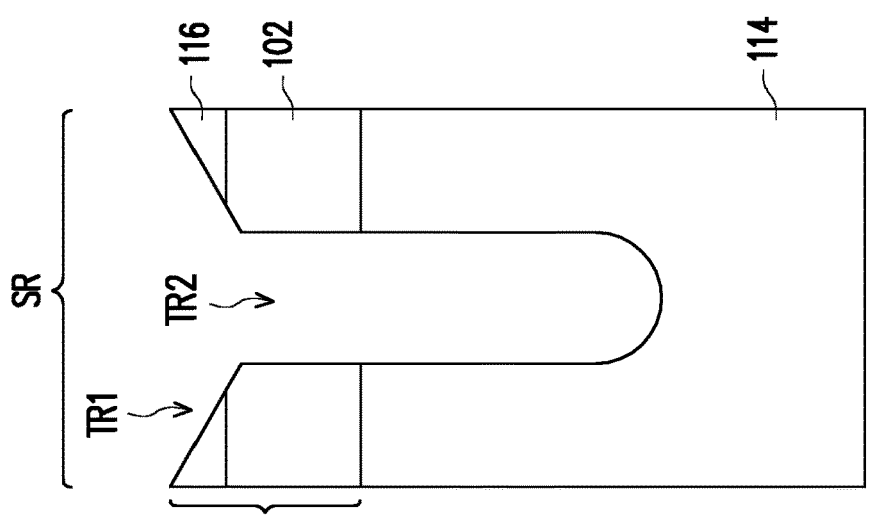
Figure 6A:
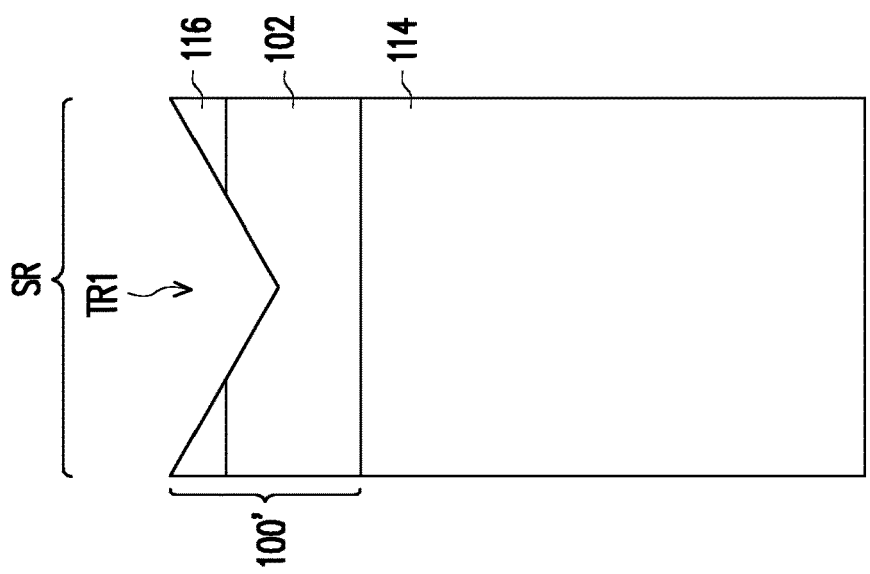

FIG. 6A to FIG. 6C are enlarged sectional views of a sub region in a method of fabricating a semiconductor package according to some other exemplary embodiments of the present disclosure. The method illustrated in FIG. 6A to FIG. 6C is similar to the method illustrated in FIG. 5A to FIG. 5C, hence the same reference numerals may be used to refer to the same or liked parts, and its detailed description will be omitted herein. The difference between the embodiments is in the second sawing process.

As illustrated in FIG. 6A, a first sawing process is performed to remove portions of the interposer structure 100' in the sub region SR to form a beveled first trench TR1. In some embodiments, the first sawing process is performed to remove portions of the redistribution structure 116 and portions of the core portion 102 so that a beveled first trench TR1 having a V-shaped profile (when viewed from a cross section) is defined. Referring to FIG. 6B, in a next step, a second sawing process is performed in the beveled first trench TR1 to remove portions of the interposer structure 100' and portions of the insulating encapsulant 114 in the sub region SR, and to form a second trench TR2 through the beveled first trench TR1. In some embodiments, the second sawing process is performed to form a second trench TR2 with curved bottom surfaces. For example, the second trench TR2 has a substantially U-shaped profile when viewed from a cross section. Referring to FIG. 6C, a third sawing process is performed in the second trench TR2 by sawing through the insulating encapsulant 114, and to form a third trench TR3 through the second trench TR2. In the exemplary embodiment, the third sawing process is performed so that the third trench TR3 is defined to reveal the tape (not shown) located underneath.

As shown in FIG. 6C, after the third sawing process, the interposer structure 100' (or connection structure) is formed with beveled surface 100-BS. Furthermore, in the exemplary embodiment, the insulating encapsulant 114 is formed with a first portion 114-1 and a second portion 114-2 surrounding the first portion 114-1 (in each of the semiconductor packages). In some embodiments, the first portion 114-1 of the insulating encapsulant 114 is encapsulating the semiconductor dies (not shown), and has a planar first surface 114-1-S. In certain embodiments, the second portion 114-2 of the insulating encapsulant 114 has a curved top surface 114-2-S located at a different level than the planar first surface 114-1-S. In other words, a step height difference exists between the planar first surface 114-1-S and the curved top surface 114-2-S. In some embodiments, the curved top surface 114-2-S also has a step height difference to the beveled surface 100-BS.

Figure 7B:
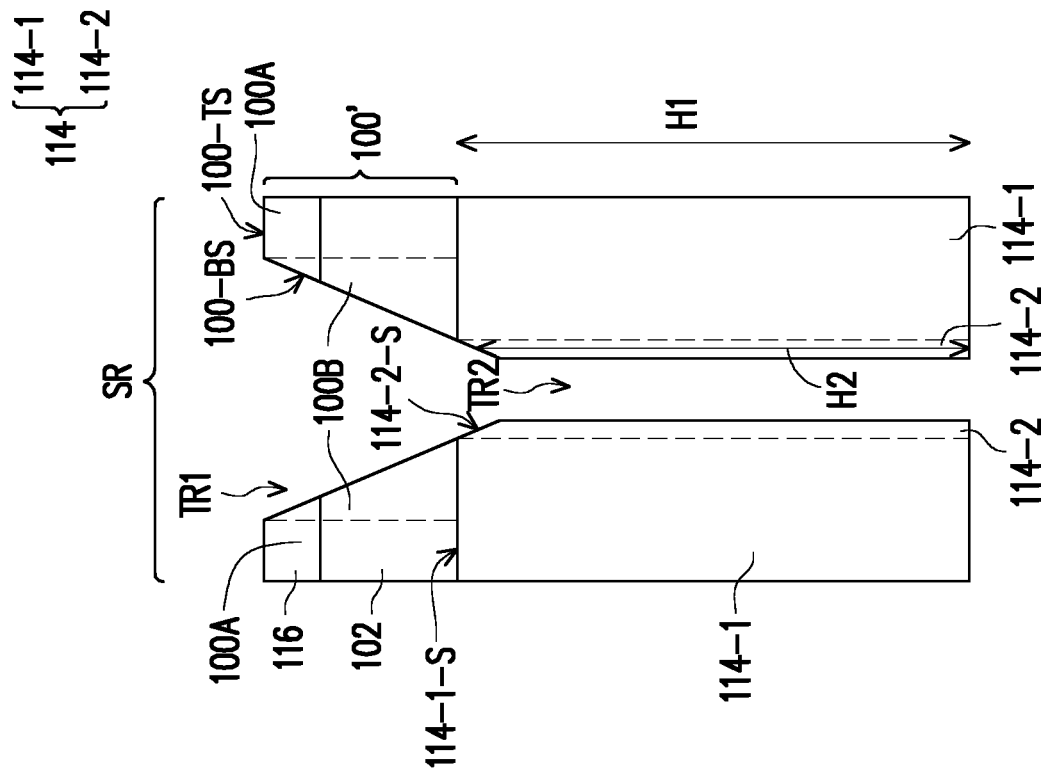
FIG. 7A and FIG. 7B are enlarged sectional views of a sub region in a method of fabricating a semiconductor package according to some other exemplary embodiments of the present disclosure.
Figure 7A:
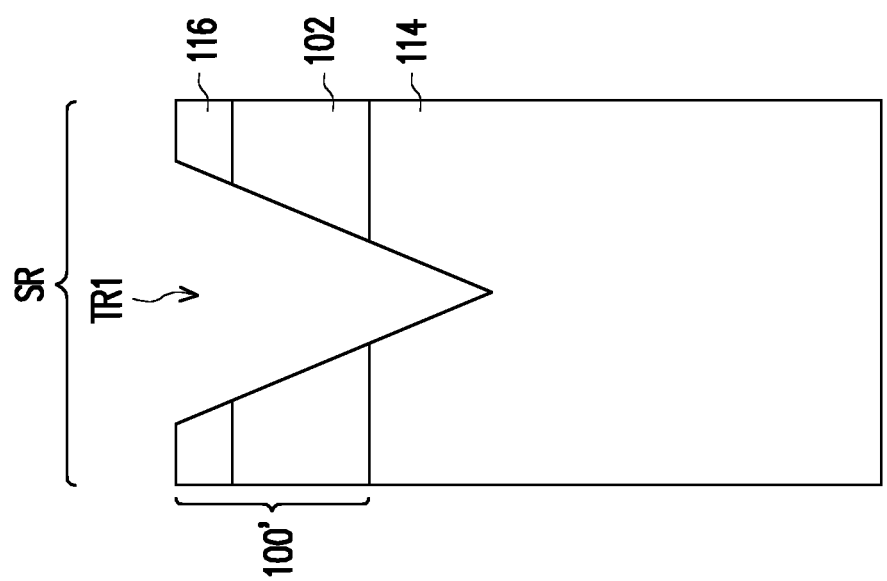

FIG. 7A and FIG. 7B are enlarged sectional views of a sub region in a method of fabricating a semiconductor package according to some other exemplary embodiments of the present disclosure. The method illustrated in FIG. 7A and FIG. 7B is similar to the method illustrated in FIG. 3A and FIG. 3B, hence the same reference numerals may be used to refer to the same or liked parts, and its detailed description will be omitted herein. The difference between the embodiments is in the sawing processes for designing different shapes of the interposer structure 100' and the insulating encapsulant 114.

As illustrated in FIG. 7A, a first sawing process is performed to remove portions of the interposer structure 100' and portions of the insulating encapsulant 114 in the sub region SR to form a beveled first trench TR1. In some embodiments, the first sawing process is performed to remove portions of the redistribution structure 116, portions of the core portion 102 and portions of the insulating encapsulant 114 so that a beveled first trench TR1 having a V-shaped profile (when viewed from a cross section) is defined. Referring to FIG. 7B, in a next step, a second sawing process is performed in the beveled first trench TR1 by sawing through the insulating encapsulant 114, and to form a second trench TR2 through the first trench TR1. In the exemplary embodiment, the second sawing process is performed so that the second trench TR2 is defined to reveal the tape (not shown) located underneath.

As shown in FIG. 7B, after the second sawing process, the interposer structure 100' (or connection structure) has a first portion 100A and a second portion 100B surrounding the first portion 100A. In some embodiments, the first portion 100A of the interposer structure 100' is formed with a planar top surface 100-TS. Furthermore, the second portion 100B of the interposer structure is formed with a beveled surface 100-BS that is joined with the planar top surface 100-TS. In some embodiments, the beveled surface 100-BS is defined by the surfaces of the redistribution structure 116 and the core portion 102. For example, a surface of the redistribution structure 116 and a surface of the core portion 102 together form the beveled surface 100-BS of the interposer structure 100'.

Furthermore, in the exemplary embodiment, the insulating encapsulant 114 is formed with a first portion 114-1 and a second portion 114-2 surrounding the first portion 114-1 (in each of the semiconductor packages). In some embodiments, the first portion 114-1 of the insulating encapsulant 114 is encapsulating the semiconductor dies (not shown), and has a planar first surface 114-1-S. In certain embodiments, the second portion 114-2 of the insulating encapsulant 114 has a beveled surface 114-2-S that is joined with the first planar surface 114-1-S. Furthermore, a height H1 of the first portion 114-1 of the insulating encapsulant 114 is greater than an average height H2 of the second portion 114-2 of the insulating encapsulant 114. In some embodiments, the beveled surface 114-2-S of the second portion 114-2 is further joined with the beveled surface 100-BS of the interposer structure 100' (connection structure).

FIG. 8A to FIG. 8C are enlarged sectional views of a sub region in a method of fabricating a semiconductor package according to some other exemplary embodiments of the present disclosure. The method illustrated in FIG. 8A to FIG. 8C is similar to the method illustrated in FIG. 7A and FIG. 7B, hence the same reference numerals may be used to refer to the same or liked parts, and its detailed description will be omitted herein. The difference between the embodiments is that a three-step sawing process is performed instead of a two-step sawing process.

As illustrated in FIG. 8A, a first sawing process is performed to remove portions of the interposer structure 100' and portions of the insulating encapsulant 114 in the sub region SR to form a beveled first trench TR1. In some embodiments, the first sawing process is performed to remove portions of the redistribution structure 116, portions of the core portion 102 and portions of the insulating encapsulant 114 so that a beveled first trench TR1 having a V-shaped profile (when viewed from a cross section) is defined. Referring to FIG. 8B, in a next step, a second sawing process is performed in the beveled first trench TR1 to remove portions of the insulating encapsulant 114 in the sub region SR, and to form a second trench TR2 through the beveled first trench TR1. Subsequently, referring to FIG. 8C, a third sawing process is performed in the second trench TR2 by sawing through the insulating encapsulant 114, and to form a third trench TR3 through the second trench TR2. In the exemplary embodiment, the third sawing process is performed so that the third trench TR3 is defined to reveal the tape (not shown) located underneath.

As shown in FIG. 8C, after the third sawing process, the interposer structure 100' (or connection structure) has a first portion 100A and a second portion 100B surrounding the first portion 100A. In some embodiments, the first portion 100A of the interposer structure 100' is formed with a planar top surface 100-TS. Furthermore, the second portion 100B of the interposer structure 100' is formed with a beveled surface 100-BS that is joined with the planar top surface 100-TS. In some embodiments, the beveled surface 100-BS is defined by the surfaces of the redistribution structure 116 and the core portion 102.

Furthermore, in the exemplary embodiment, the insulating encapsulant 114 is formed with a first portion 114-1, a second portion 114-2 surrounding the first portion 114-1, and a connecting portion 114-C located in between the first portion 114-1 and the second portion 114-2 (in each of the semiconductor packages). In some embodiments, the connecting portion 114-C is connecting the first portion 114-1 of the insulating encapsulant 114 to the second portion 114-2 of the insulating encapsulant 114. In some embodiments, the first portion 114-1 of the insulating encapsulant 114 is encapsulating the semiconductor dies (not shown), and has a planar first surface 114-1-S. In certain embodiments, the second portion 114-2 of the insulating encapsulant 114 has a planar second surface 114-2-S located at a different level than the planar first surface 114-1-S. In other words, a step height difference exists between the planar first surface 114-1-S and the planar second surface 114-2-S. In certain embodiments, the connecting portion 114-C has a beveled surface 114-C-S that is joined with the planar first surface 114-1-S, and has a step height difference to the planar second surface 114-2-S. In some embodiments, the beveled surface 114-C-S of the connecting portion 114-C is further joined with the beveled surface 100-BS of the interposer structure 100' (connection structure). Furthermore, a height H1 of the first portion 114-1 of the insulating encapsulant 114 is greater than an average height H3 of the connecting portion 114-C of the insulating encapsulant 114, and greater than a height H2a of the second portion 114-2 of the insulating encapsulant 114.

Figure 9B:
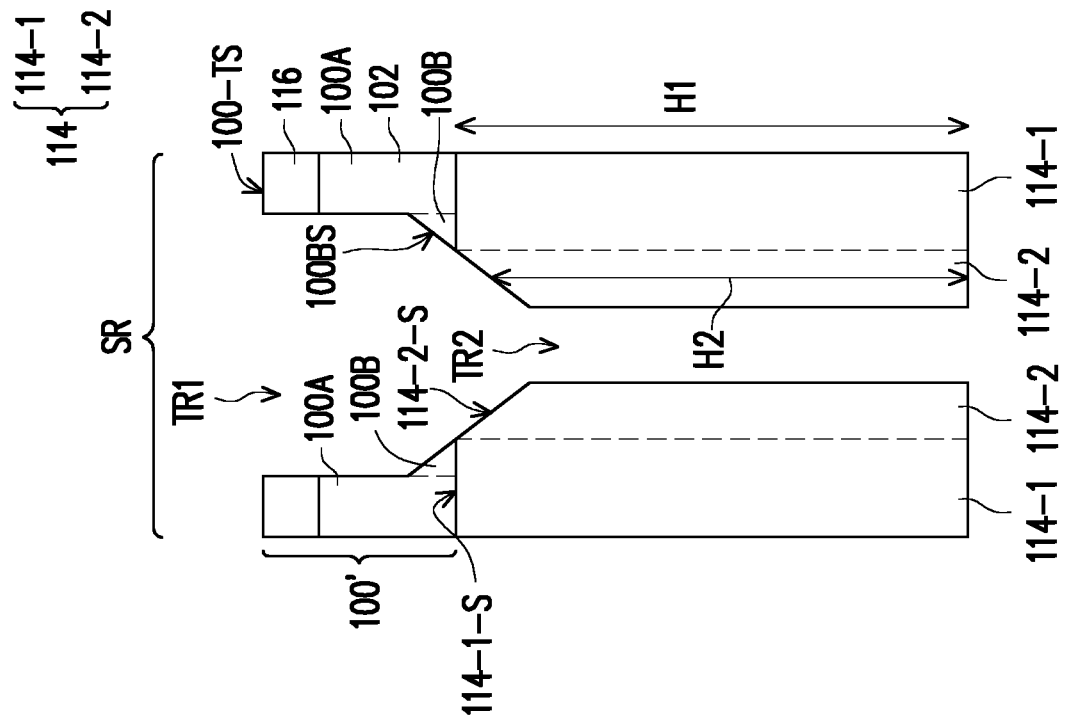
FIG. 9A and FIG. 9B are enlarged sectional views of a sub region in a method of fabricating a semiconductor package according to some other exemplary embodiments of the present disclosure.
Figure 9A:
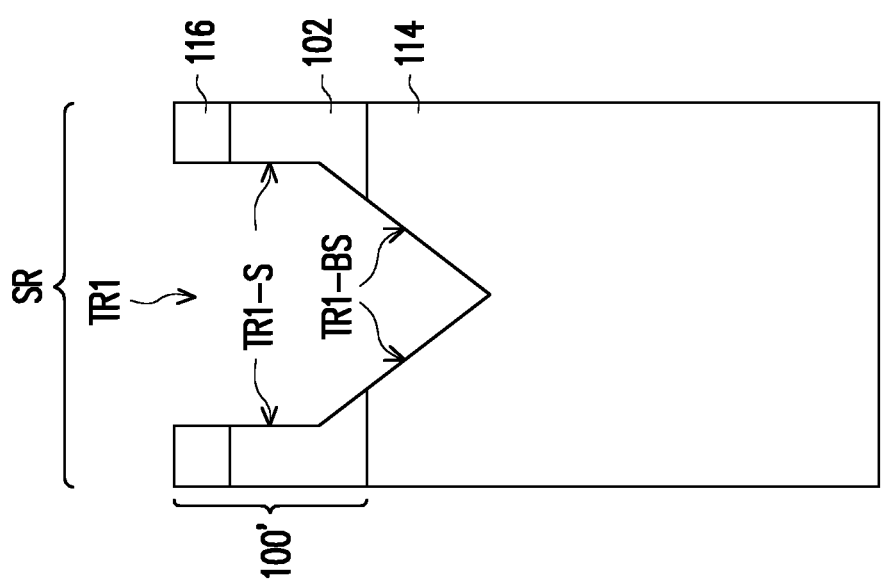

FIG. 9A and FIG. 9B are enlarged sectional views of a sub region in a method of fabricating a semiconductor package according to some other exemplary embodiments of the present disclosure. The method illustrated in FIG. 8A and FIG. 8B is similar to the method illustrated in FIG. 7A and FIG. 7B, hence the same reference numerals may be used to refer to the same or liked parts, and its detailed description will be omitted herein. The difference between the embodiments is in the first sawing process.

In the embodiment shown in FIG. 7A, the first sawing process is performed to form a first trench TR1 having a V-shaped profile (when viewed from a cross section). However, the disclosure is not limited thereto. Referring to FIG. 9A, a first sawing process is performed to remove portions of the interposer structure 100' and portions of the insulating encapsulant 114 in the sub region SR to form a first trench TR1, wherein the first trench TR1 has planar side surfaces TR1-S and beveled surfaces TR1-BS joined with the planar side surfaces TR1-S. Referring to FIG. 9B, in a next step, a second sawing process is performed in the first trench TR1 by sawing through the insulating encapsulant 114, and to form a second trench TR2 through the first trench TR1. In the exemplary embodiment, the second sawing process is performed so that the second trench TR2 is defined to reveal the tape (not shown) located underneath.

As shown in FIG. 9B, after the second sawing process, the interposer structure 100' (or connection structure) has a first portion 100A and a second portion 100B surrounding the first portion 100A. In some embodiments, the first portion 100A of the interposer structure 100' is formed with a planar top surface 100-TS. Furthermore, the second portion 100B of the interposer structure 100' is formed with a beveled surface 100-BS that has a step height difference to the planar top surface 100-TS. In some embodiments, the beveled surface 100-BS is defined by a surface of the core portion 102.

Furthermore, in the exemplary embodiment, the insulating encapsulant 114 is formed with a first portion 114-1 and a second portion 114-2 surrounding the first portion 114-1 (in each of the semiconductor packages). In some embodiments, the first portion 114-1 of the insulating encapsulant 114 is encapsulating the semiconductor dies (not shown), and has a planar first surface 114-1-S. In certain embodiments, the second portion 114-2 of the insulating encapsulant 114 has a beveled surface 114-2-S that is joined with the first planar surface 114-1-S. Furthermore, a height H1 of the first portion 114-1 of the insulating encapsulant 114 is greater than an average height H2 of the second portion 114-2 of the insulating encapsulant 114. In some embodiments, the beveled surface 114-2-S of the second portion 114-2 is further joined with the beveled surface 100-BS of the interposer structure 100' (connection structure).

FIG. 10A to FIG. 10C are enlarged sectional views of a sub region in a method of fabricating a semiconductor package according to some other exemplary embodiments of the present disclosure. The method illustrated in FIG. 10A to FIG. 10C is similar to the method illustrated in FIG. 9A and FIG. 9B, hence the same reference numerals may be used to refer to the same or liked parts, and its detailed description will be omitted herein. The difference between the embodiments is that a three-step sawing process is performed instead of a two-step sawing process.

As illustrated in FIG. 10A, a first sawing process is performed to remove portions of the interposer structure 100' and portions of the insulating encapsulant 114 in the sub region SR to form a first trench TR1, wherein the first trench TR1 has planar side surfaces TR1-S and beveled surfaces TR1-BS joined with the planar side surfaces TR1-S. Referring to FIG. 10B, in a next step, a second sawing process is performed in the first trench TR1 to remove portions of the insulating encapsulant 114 in the sub region SR, and to form a second trench TR2 through the beveled first trench TR1. Subsequently, referring to FIG. 10C, a third sawing process is performed in the second trench TR2 by sawing through the insulating encapsulant 114, and to form a third trench TR3 through the second trench TR2. In the exemplary embodiment, the third sawing process is performed so that the third trench TR3 is defined to reveal the tape (not shown) located underneath.

As shown in FIG. 10C, after the third sawing process, the interposer structure 100' (or connection structure) has a first portion 100A and a second portion 100B surrounding the first portion 100A. In some embodiments, the first portion 100A of the interposer structure 100' is formed with a planar top surface 100-TS. Furthermore, the second portion 100B of the interposer structure is formed with a beveled surface 100-BS that has a step height difference to the planar top surface 100-TS.

Furthermore, in the exemplary embodiment, the insulating encapsulant 114 is formed with a first portion 114-1, a second portion 114-2 surrounding the first portion 114-1, and a connecting portion 114-C located in between the first portion 114-1 and the second portion 114-2 (in each of the semiconductor packages). In some embodiments, the connecting portion 114-C is connecting the first portion 114-1 of the insulating encapsulant 114 to the second portion 114-2 of the insulating encapsulant 114. In some embodiments, the first portion 114-1 of the insulating encapsulant 114 is encapsulating the semiconductor dies (not shown), and has a planar first surface 114-1-S. In certain embodiments, the second portion 114-2 of the insulating encapsulant 114 has a planar second surface 114-2-S located at a different level than the planar first surface 114-1-S. In other words, a step height difference exists between the planar first surface 114-1-S and the planar second surface 114-2-S. In certain embodiments, the connecting portion 114-C has a beveled surface 114-C-S that is joined with the planar first surface 114-1-S, and has a step height difference to the planar second surface 114-2-S. In some embodiments, the beveled surface 114-C-S of the connecting portion 114-C is further joined with the beveled surface 100-BS of the interposer structure 100' (connection structure). Furthermore, a height H1 of the first portion 114-1 of the insulating encapsulant 114 is greater than an average height H3 of the connecting portion 114-C of the insulating encapsulant 114, and greater than a height H2a of the second portion 114-2 of the insulating encapsulant 114.

Figure 11A:
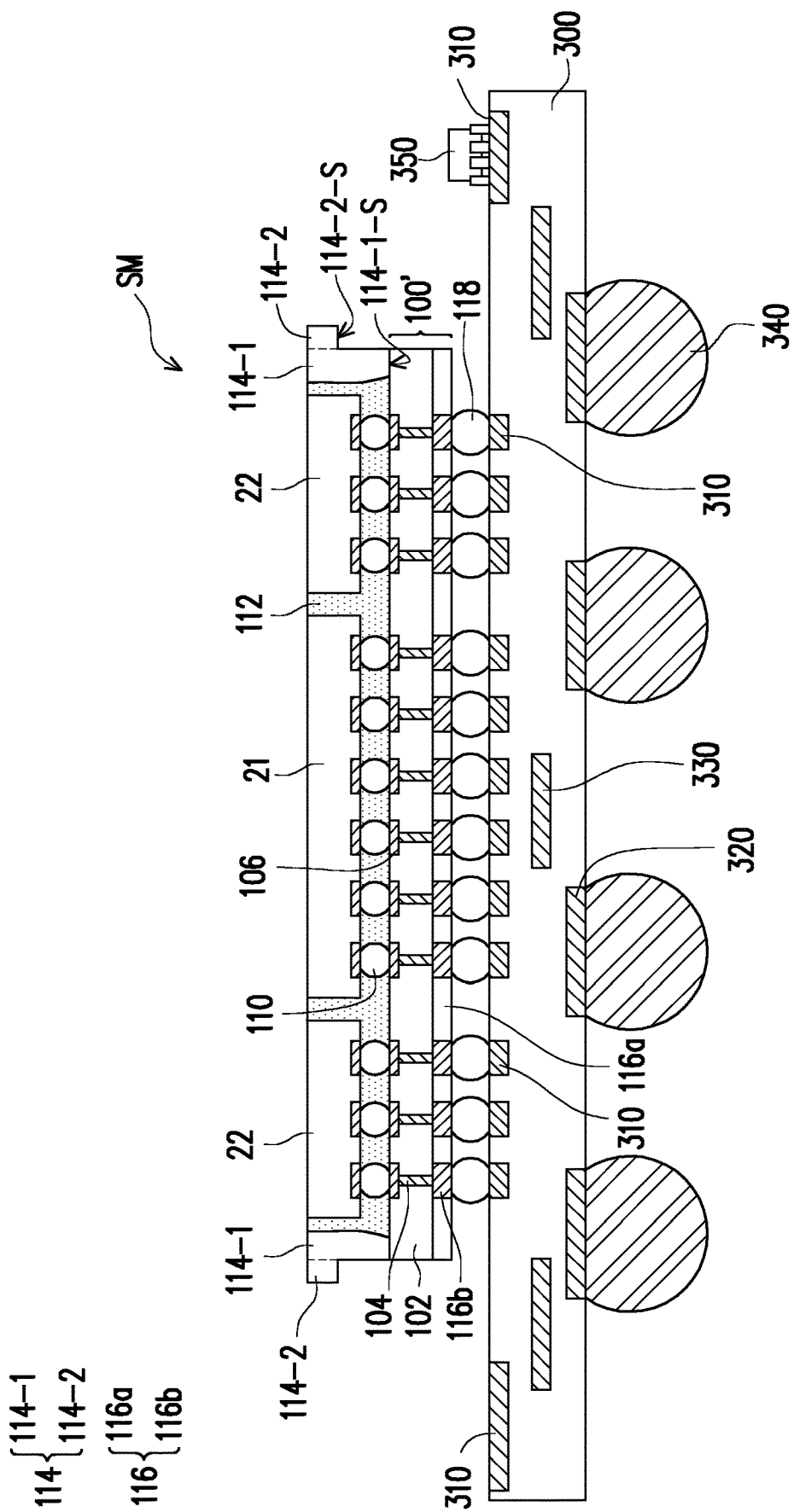
FIG. 11A to FIG. 11B are schematic sectional views of various stages in a method of fabricating a package structure according to some exemplary embodiments of the present disclosure.
Figure 11B:
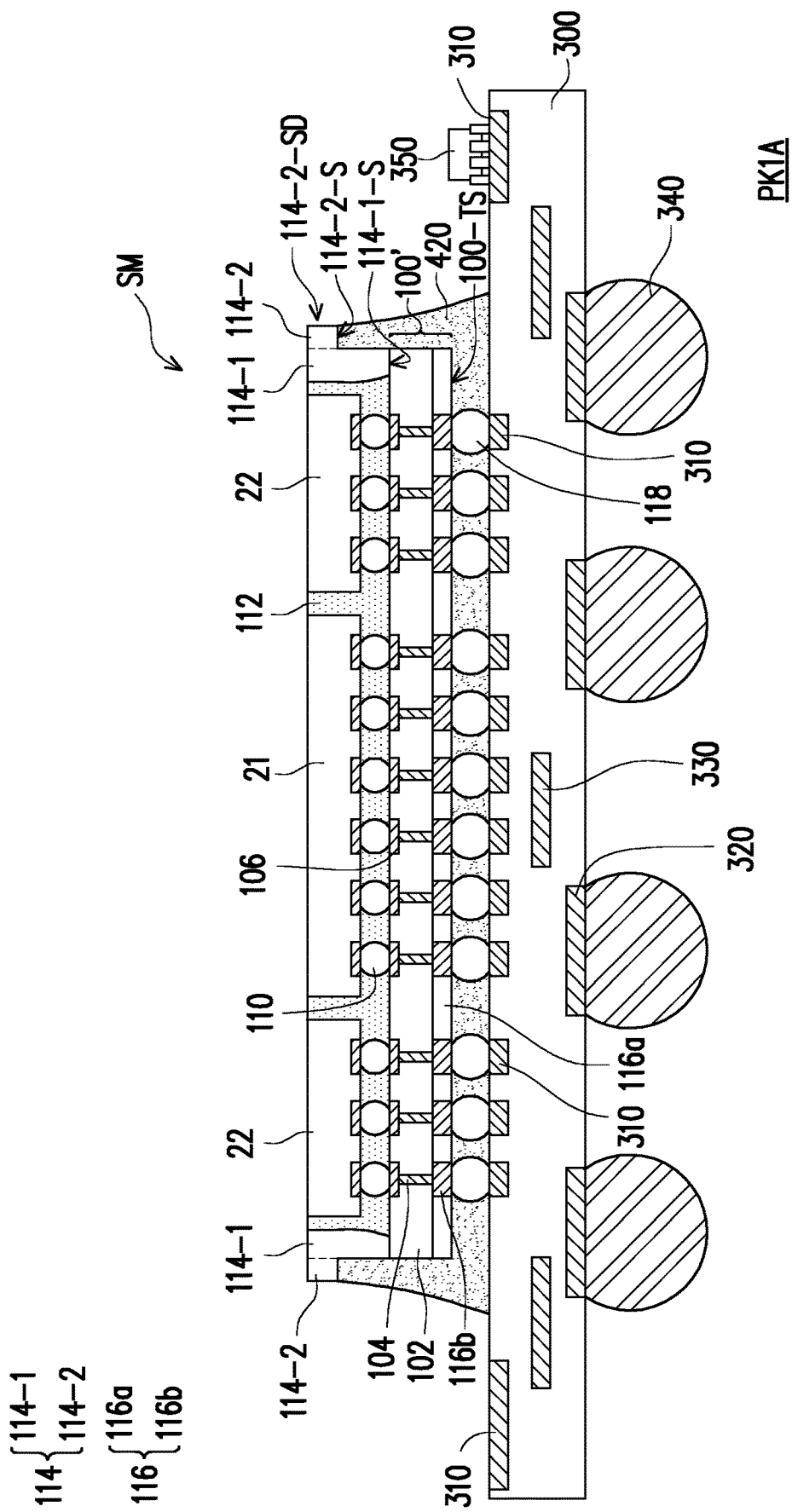

FIG. 11A to FIG. 11B are schematic sectional views of various stages in a method of fabricating a package structure according to some exemplary embodiments of the present disclosure. As illustrated in FIG. 11A, in the exemplary embodiment, the semiconductor package SM obtained in FIG. 1I is mounted or attached onto a circuit substrate 300 through the conductive terminals 118. In some embodiments, the circuit substrate 300 include contact pads 310, contact pads 320, metallization layers 330, and vias (not shown). In some embodiments, the contact pads 310 and the contact pads 320 are respectively distributed on two opposite sides of the circuit substrate 300, and are exposed for electrically connecting with later-formed elements/features. In some embodiments, the metallization layers 330 and the vias are embedded in the circuit substrate 300 and together provide routing function for the circuit substrate 300, wherein the metallization layers 330 and the vias are electrically connected to the contact pads 310 and the contact pads 320. In other words, at least some of the contact pads 310 are electrically connected to some of the contact pads 320 through the metallization layers 330 and the vias. In some embodiments, the contact pads 310 and the contact pads 320 may include metal pads or metal alloy pads. In some embodiments, the materials of the metallization layers 330 and the vias may be substantially the same or similar to the material of the contact pads 310 and the contact pads 320.

In some embodiments, as shown in FIG. 11A, the semiconductor package SM is bonded to the circuit substrate 300 through physically connecting the conductive terminals 118 and the contact pads 310 to form a stacked structure, where the semiconductor package SM is physically and electrically connected to the circuit substrate 300. In some embodiments, the circuit substrate 300 is such as an organic flexible substrate or a printed circuit board. In such embodiments, the conductive terminals 118 are, for example, chip connectors. In some embodiments, a plurality of conductive balls 340 are respectively formed on the substrate 300. As shown in FIG. 11A, for example, the conductive balls 340 are connected to the contact pads 320 of the circuit substrate 300. In other words, the conductive balls 340 are electrically connected to the circuit substrate 300 through the contact pads 320. Through the contact pads 310 and the contact pads 320, some of the conductive balls 340 are electrically connected to the semiconductor package SM (e.g. the semiconductor dies 21 and 22 included therein). In some embodiments, the conductive balls 340 are, for example, solder balls or BGA balls. In some embodiments, the semiconductor package SM is bonded to the circuit substrate 300 through physically connecting the conductive terminals 118 and the contact pads 310 of the circuit substrate 300 by a chip on wafer on substrate (CoWoS) packaging processes. In addition, as illustrated in FIG. 0.11A, one or more passive component 350 (or integrated passive device) may be mounted on the circuit substrate 300. For example, the passive component 350 may be mounted on the contact pads 310 of the circuit substrate 300 through a soldering process. The disclosure is not limited thereto.

Referring to FIG. 11B, in a next step, an underfill structure 420 is formed to fill in the spaces between the circuit substrate 300 and the semiconductor package SM. In some embodiments, the underfill structure 420 fills up the spaces in between adjacent conductive terminals 118 and covers the conductive terminals 118. In some embodiments, the underfill structure 420 covers and is in contact with the planar top surface 100-TS of the interposer structure 100' and the planar second surface 114-2-S of the insulating encapsulant 114. In certain embodiments, the underfill structure 420 has sidewalls that are aligned with sidewalls 114-2-SD of the second portion 114-2 of the insulating encapsulant 114. Furthermore, the passive component 350 is exposed by the underfill structure 420, and kept a distance apart from the underfill structure 420. In other words, the underfill structure 420 does not cover the passive component 350.

Figure 12:
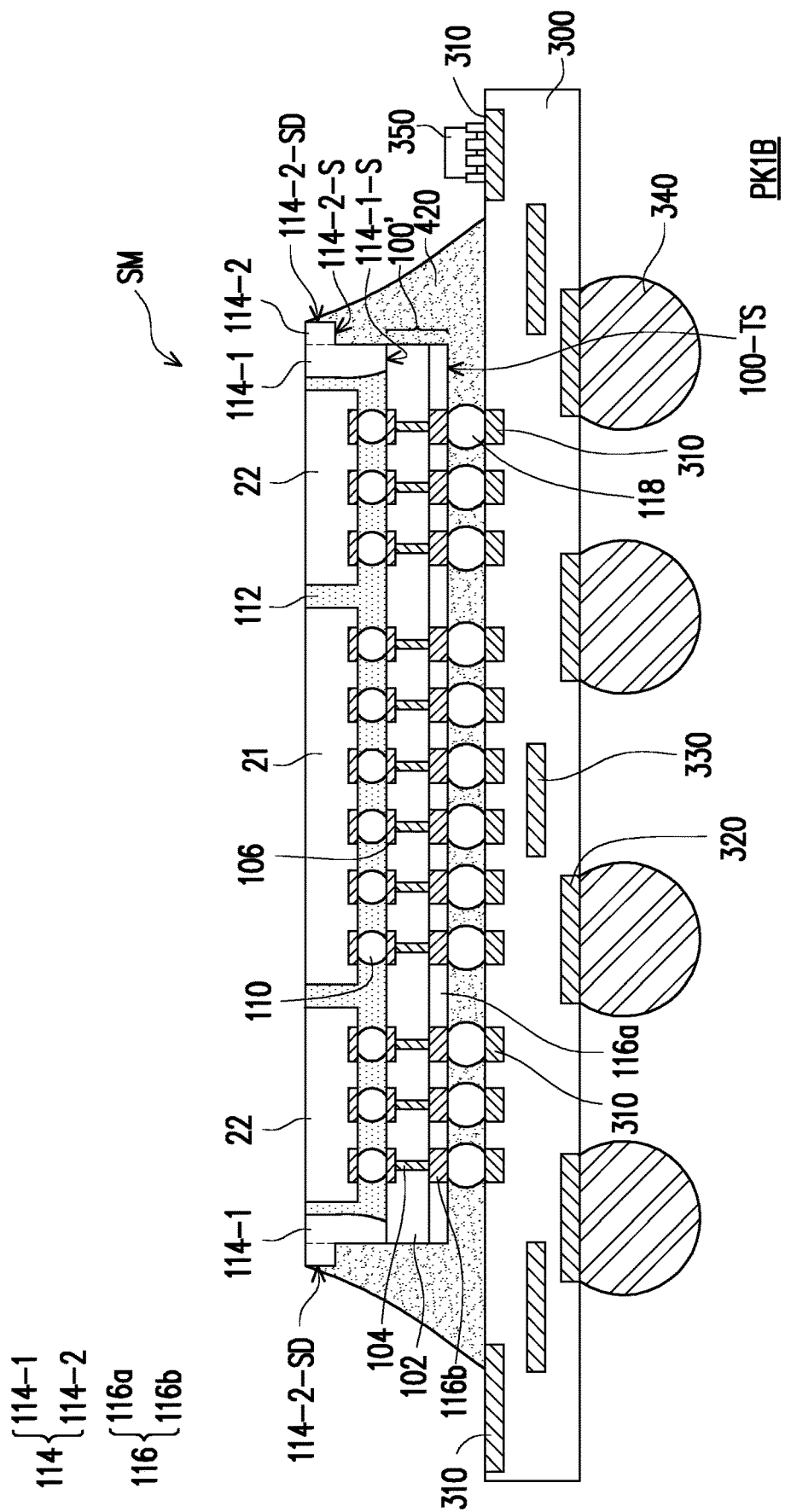
FIG. 12 is a schematic sectional view of a package structure according to some other exemplary embodiments of the present disclosure.

FIG. 12 is a schematic sectional view of a package structure according to some other exemplary embodiments of the present disclosure. The package structure PK1B illustrated in FIG. 12 is similar to the package structure PK1A illustrated in FIG. 11, hence the same reference numerals are used to refer to the same or liked parts, and its detailed description will be omitted herein. In the package structure PK1B, the underfill structure 420 further covers the sidewalls 114-2-SD of the second portion 114-2 of the insulating encapsulant 114. In other words, a height of the underfill structure 420 may be substantially equal to a height of the semiconductor package SM. Similar to the above embodiments, the insulating encapsulant 114 is designed with a protruding second portion 114-2, thus a stress located at interfaces between the semiconductor package SM and the underfill structure 420 may be reduced.

Figure 13:
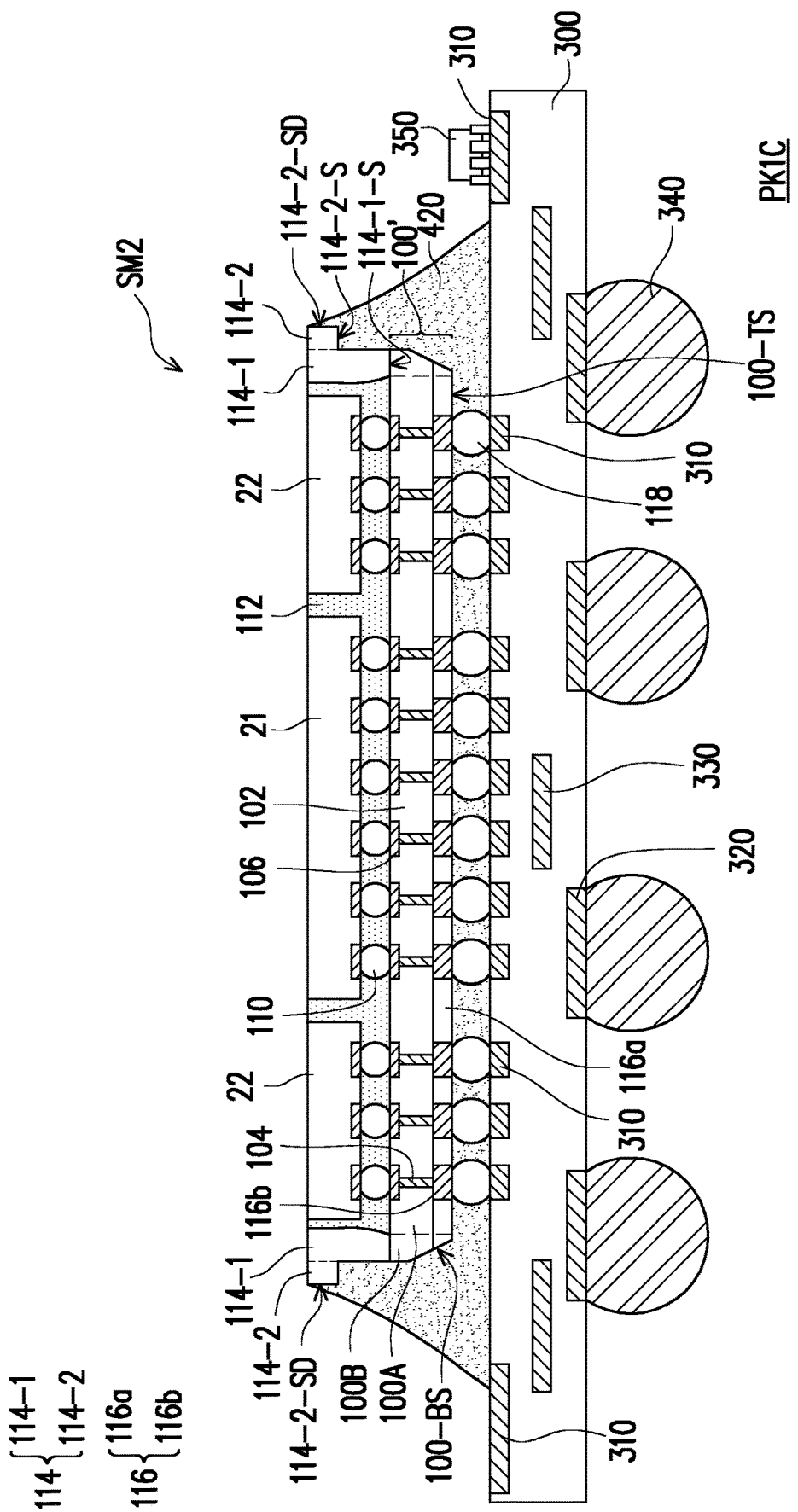
FIG. 13 is a schematic sectional view of a package structure according to some other exemplary embodiments of the present disclosure.

FIG. 13 is a schematic sectional view of a package structure according to some other exemplary embodiments of the present disclosure. The package structure PK1C illustrated in FIG. 13 is similar to the package structure PK1B illustrated in FIG. 12, hence the same reference numerals are used to refer to the same or liked parts, and its detailed description will be omitted herein. The package structure PK1B illustrated in FIG. 12 is formed by performing the sawing processes described in FIG. 2A and FIG. 2B. The package structure PK1C is formed by performing the sawing processes described in FIG. 5A to FIG. 5C. As shown in FIG. 13, the interposer structure 100' is formed with a first portion 100A and a second portion 100B surrounding the first portion 100A. In some embodiments, the first portion 100A of the interposer structure 100' is formed with a planar top surface 100-TS. Furthermore, the second portion 100B of the interposer structure is formed with a beveled surface 100-BS that is joined with the planar top surface 100-TS. In some embodiments, the beveled surface 100-BS is defined by the surfaces of the redistribution structure 116 and the core portion 102.

Furthermore, in the exemplary embodiment, the insulating encapsulant 114 is formed with a first portion 114-1 and a second portion 114-2 surrounding the first portion 114-1. In some embodiments, the first portion 114-1 of the insulating encapsulant 114 is encapsulating the semiconductor dies 21 and 22, and has a planar first surface 114-1-S. In certain embodiments, the second portion 114-2 of the insulating encapsulant 114 has a planar second surface 114-2-S located at a different level than the planar first surface 114-1-S. In other words, a step height difference exists between the planar first surface 114-1-S and the planar second surface 114-2-S. In some embodiments, the planar second surface 114-2-S also has a step height difference to the beveled surface 100-BS. Similar to the above embodiments, the insulating encapsulant 114 is designed with a protruding second portion 114-2, and the interposer structure 100' is designed with a beveled surface 100-BS, thus a stress located at interfaces between the semiconductor package SM2 and the underfill structure 420 may be reduced.

Figure 14:
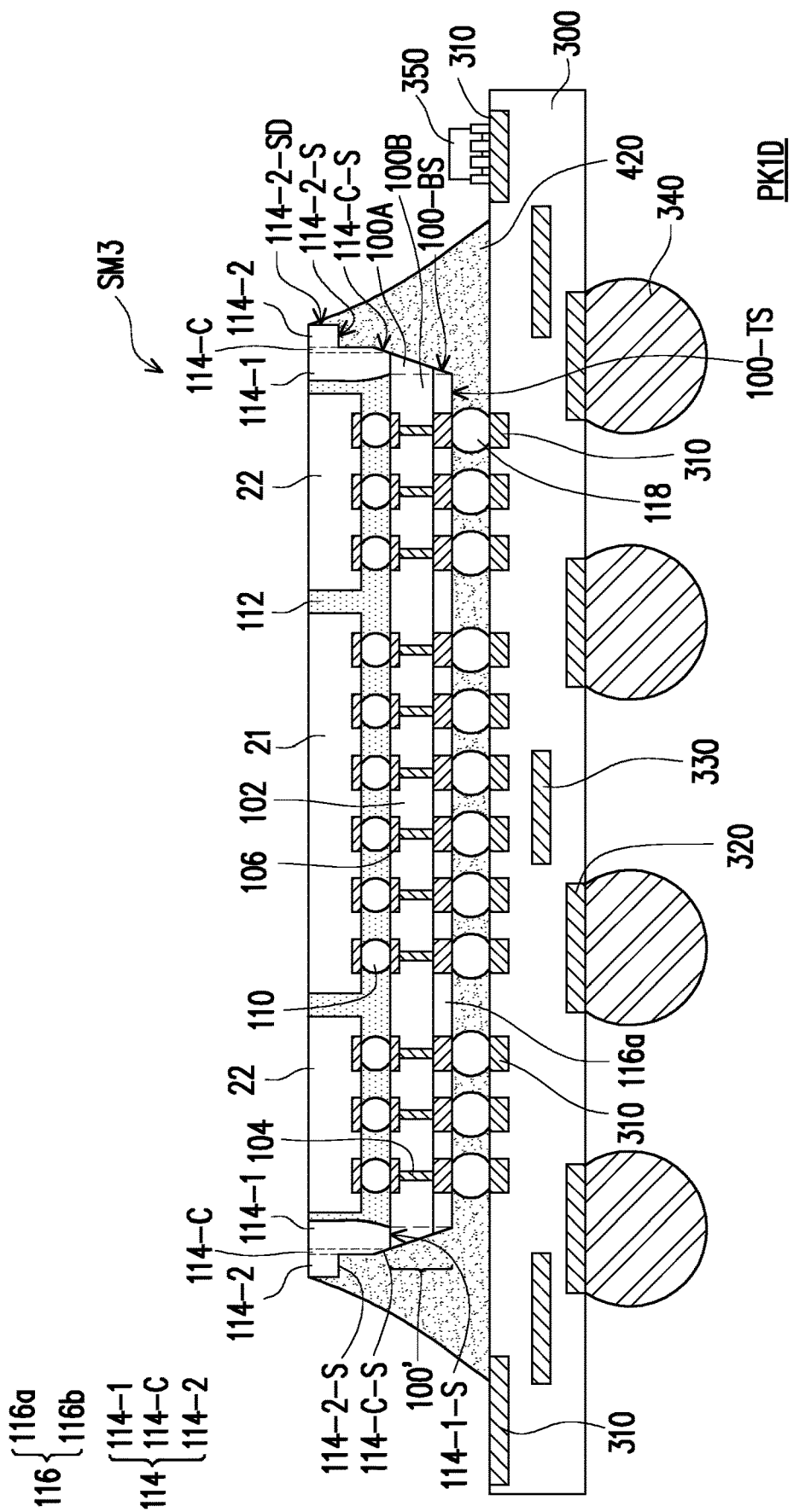
FIG. 14 is a schematic sectional view of a package structure according to some other exemplary embodiments of the present disclosure.

FIG. 14 is a schematic sectional view of a package structure according to some other exemplary embodiments of the present disclosure. The package structure PK1D illustrated in FIG. 14 is similar to the package structure PK1B illustrated in FIG. 12, hence the same reference numerals are used to refer to the same or liked parts, and its detailed description will be omitted herein. The package structure PK1B illustrated in FIG. 12 is formed by performing the sawing processes described in FIG. 2A and FIG. 2B. The package structure PK1D is formed by performing the sawing processes described in FIG. 8A to FIG. 8C.

As illustrated in FIG. 14 the interposer structure 100' (or connection structure) is formed with a first portion 100A and a second portion 100B surrounding the first portion 100A. In some embodiments, the first portion 100A of the interposer structure 100' is formed with a planar top surface 100-TS. Furthermore, the second portion 100B of the interposer structure is formed with a beveled surface 100-BS that is joined with the planar top surface 100-TS. In some embodiments, the beveled surface 100-BS is defined by the surfaces of the redistribution structure 116 and the core portion 102.

Furthermore, in the exemplary embodiment, the insulating encapsulant 114 is formed with a first portion 114-1, a second portion 114-2 surrounding the first portion 114-1, and a connecting portion 114-C located in between the first portion 114-1 and the second portion 114-2. In some embodiments, the connecting portion 114-C is connecting the first portion 114-1 of the insulating encapsulant 114 to the second portion 114-2 of the insulating encapsulant 114. In some embodiments, the first portion 114-1 of the insulating encapsulant 114 is encapsulating the semiconductor dies 21 and 22, and has a planar first surface 114-1-S. In certain embodiments, the second portion 114-2 of the insulating encapsulant 114 has a planar second surface 114-2-S located at a different level than the planar first surface 114-1-S. In other words, a step height difference exists between the planar first surface 114-1-S and the planar second surface 114-2-S. In certain embodiments, the connecting portion 114-C has a beveled surface 114-C-S that is joined with the planar first surface 114-1-S, and has a step height difference to the planar second surface 114-2-S. In some embodiments, the beveled surface 114-C-S of the connecting portion 114-C is further joined with the beveled surface 100-BS of the interposer structure 100' (connection structure). Similar to the above embodiments, the insulating encapsulant 114 is designed with protruding (second portion 114-2) and beveled portions (connecting portion 114-C), and the interposer structure 100' is designed with a beveled surface 100-BS, thus a stress located at interfaces between the semiconductor package SM3 and the underfill structure 420 may be reduced.

Figure 15:
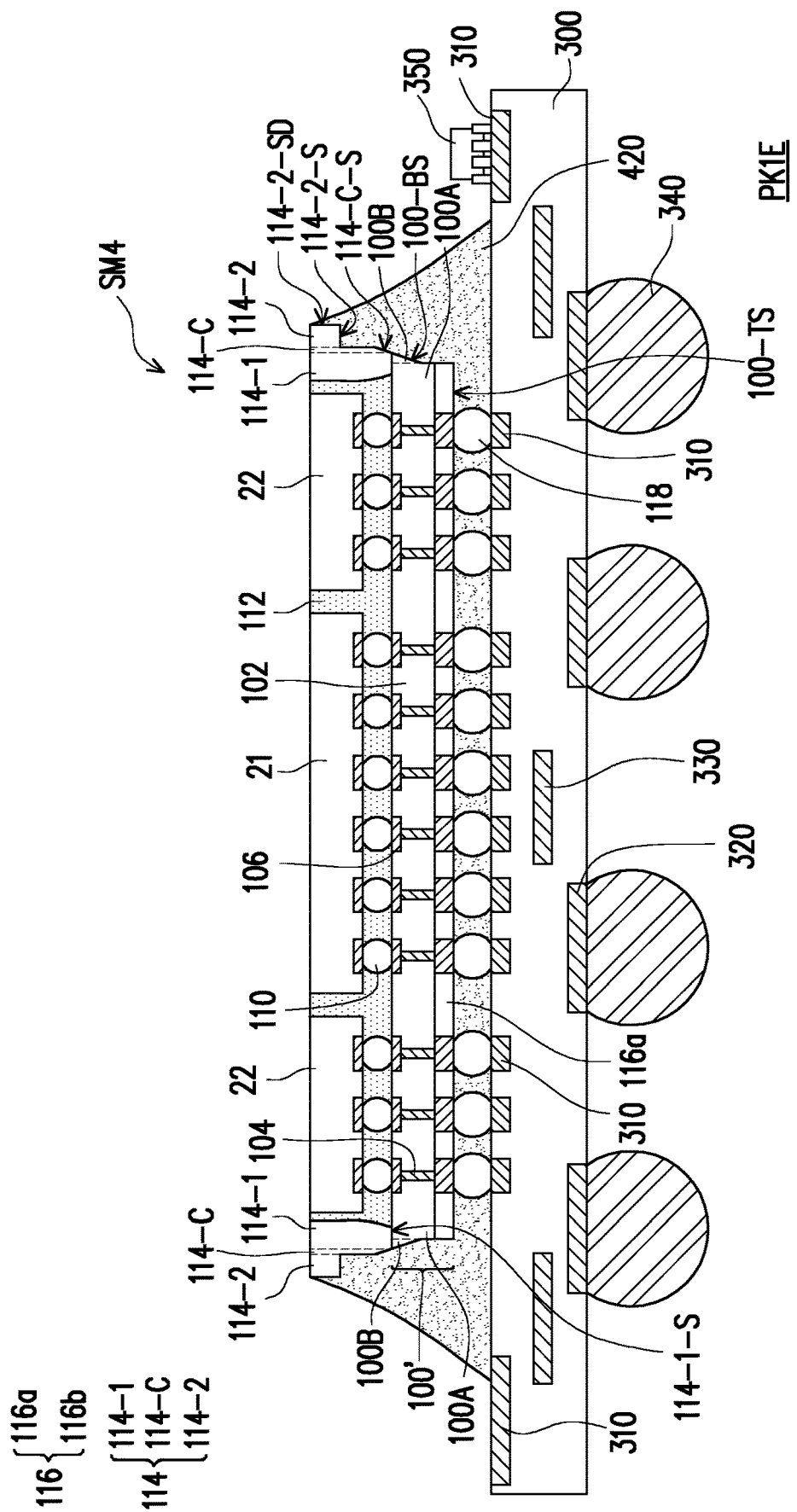
FIG. 15 is a schematic sectional view of a package structure according to some other exemplary embodiments of the present disclosure.

FIG. 15 is a schematic sectional view of a package structure according to some other exemplary embodiments of the present disclosure. The package structure PK1E illustrated in FIG. 14 is similar to the package structure PK1B illustrated in FIG. 12, hence the same reference numerals are used to refer to the same or liked parts, and its detailed description will be omitted herein. The package structure PK1B illustrated in FIG. 12 is formed by performing the sawing processes described in FIG. 2A and FIG. 2B. The package structure PK1E is formed by performing the sawing processes described in FIG. 10A to FIG. 10C.

For example, as illustrated in FIG. 15 the interposer structure 100' (or connection structure) is formed with a first portion 100A and a second portion 100B surrounding the first portion 100A. In some embodiments, the first portion 100A of the interposer structure 100' is formed with a planar top surface 100-TS. Furthermore, the second portion 100B of the interposer structure is formed with a beveled surface 100-BS that has a step height difference to the planar top surface 100-TS.

Furthermore, in the exemplary embodiment, the insulating encapsulant 114 is formed with a first portion 114-1, a second portion 114-2 surrounding the first portion 114-1, and a connecting portion 114-C located in between the first portion 114-1 and the second portion 114-2 (in each of the semiconductor packages). In some embodiments, the connecting portion 114-C is connecting the first portion 114-1 of the insulating encapsulant 114 to the second portion 114-2 of the insulating encapsulant 114. In some embodiments, the first portion 114-1 of the insulating encapsulant 114 is encapsulating the semiconductor dies (not shown), and has a planar first surface 114-1-S. In certain embodiments, the second portion 114-2 of the insulating encapsulant 114 has a planar second surface 114-2-S located at a different level than the planar first surface 114-1-S. In other words, a step height difference exists between the planar first surface 114-1-S and the planar second surface 114-2-S. In certain embodiments, the connecting portion 114-C has a beveled surface 114-C-S that is joined with the planar first surface 114-1-S, and has a step height difference to the planar second surface 114-2-S. In some embodiments, the beveled surface 114-C-S of the connecting portion 114-C is further joined with the beveled surface 100-BS of the interposer structure 100' (connection structure). Similar to the above embodiments, the insulating encapsulant 114 is designed with protruding (second portion 114-2) and beveled portions (connecting portion 114-C), and the interposer structure 100' is designed with a beveled surface 100-BS, thus a stress located at interfaces between the semiconductor package SM4 and the underfill structure 420 may be reduced.

Figure 16:
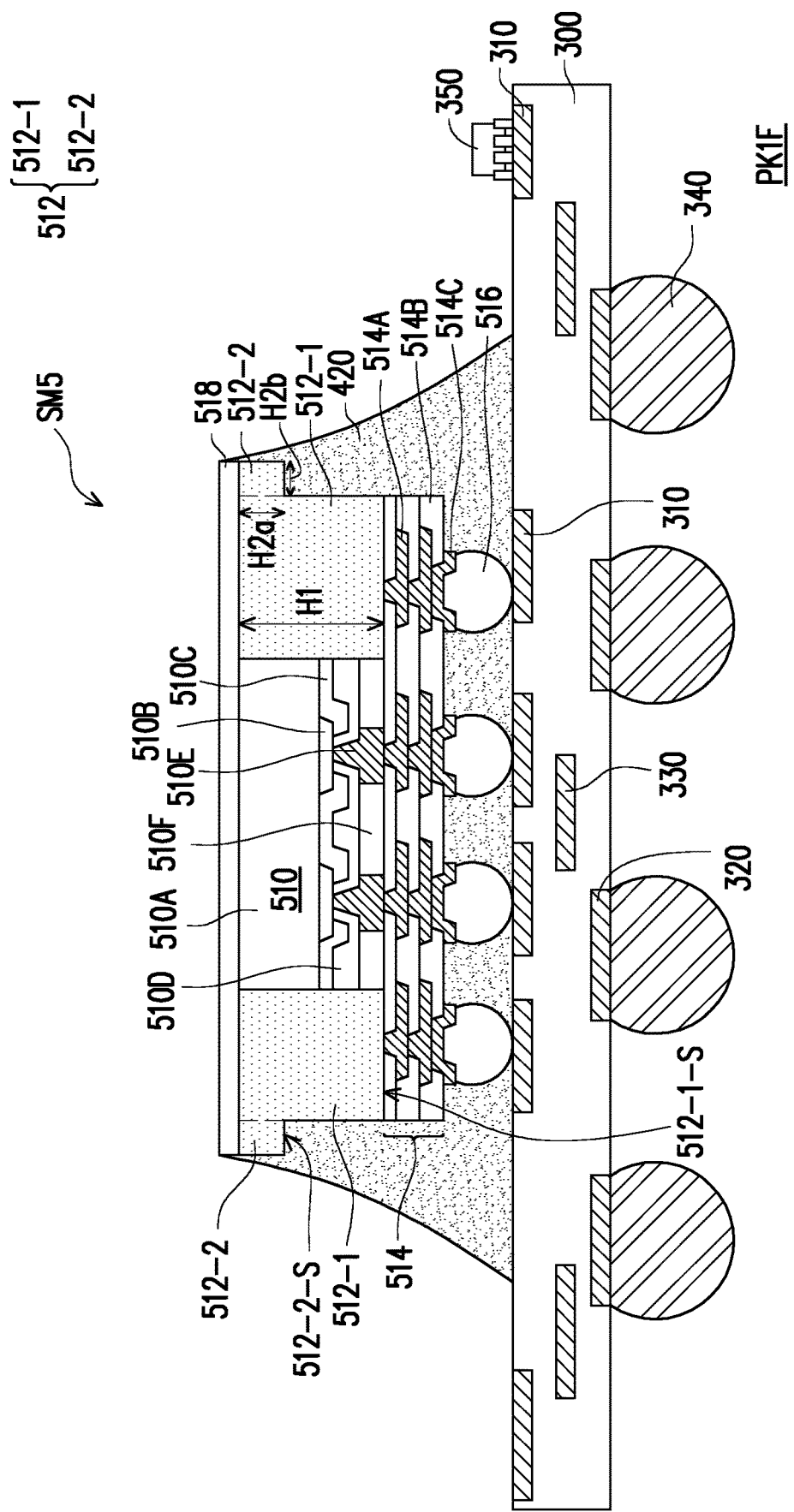
FIG. 16 is a schematic sectional view of a package structure according to some other exemplary embodiments of the present disclosure.

FIG. 16 is a schematic sectional view of a package structure according to some other exemplary embodiments of the present disclosure. The package structure PK1F illustrated in FIG. 16 is similar to the package structure PK1B illustrated in FIG. 12, hence the same reference numerals are used to refer to the same or liked parts, and its detailed description will be omitted herein. The difference between the embodiments is in design of the semiconductor package. For example, in FIG. 12, the semiconductor package SM having a plurality of semiconductor dies 21, 22 disposed on an interposer structure 100' is further mounted onto the circuit substrate 300 so as to form a chip on wafer on substrate (CoWoS) package. In comparison, referring to FIG. 16, the interposer is omitted from the semiconductor package SM5, and the semiconductor package SM5 is disposed on the circuit substrate 300 through flip chip bonding.

Referring to FIG. 16, the semiconductor package SM5 includes at least one semiconductor die 510, an insulating encapsulant 512, a redistribution structure 514 (or connection structure), a plurality of conductive terminals 516, and a dielectric layer 518. In the exemplary embodiment, the semiconductor die 510 is attached onto the dielectric layer 518. For example, the semiconductor die 510 may be attached to the dielectric layer 518 through a die-attach film. In some embodiments, the semiconductor die 510, for example, includes a semiconductor substrate 510A, a plurality of conductive pads 510B, a passivation layer 510C, a post passivation layer 510D, a plurality of conductive vias 510E, and a protection layer 510F.

In some embodiments, the passivation layer 510C is formed over the semiconductor substrate 510A and has openings that partially expose the conductive pads 510B on the semiconductor substrate 510A. The semiconductor substrate 510A may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 510B may be aluminum pads, copper pads or other suitable metal pads. The passivation layer 510C may be a silicon oxide layer, a silicon nitride layer, a silicon oxy-nitride layer or a dielectric layer formed of any suitable dielectric materials. In the exemplary embodiment, the post passivation layer 510D is optionally formed over the passivation layer 510C. The post passivation layer 510D covers the passivation layer 510C and has a plurality of contact openings. The conductive pads 510B are partially exposed by the contact openings of the post passivation layer 510D. The post passivation layer 510D may be a benzocyclobutene (BCB) layer, a polyimide layer, a polybenzoxazole (PBO) layer, or a dielectric layer formed by other suitable polymers. In some embodiments, the conductive posts or conductive vias 510E are formed on the conductive pads 510B by plating. In some embodiments, the protection layer 510F is formed on the post passivation layer 510D covering the conductive posts or conductive vias 510E so as to protect the conductive posts or conductive vias 510E.

Furthermore, in some embodiments, the insulating encapsulant 512 is formed to encapsulate and surround the semiconductor die 510. Although one semiconductor die 510 is illustrated in FIG. 16, it should be noted that the number of semiconductor dies 510 in the semiconductor package SM5 is not limited thereto. For example, when a plurality of semiconductor dies 510 exists, the insulating encapsulant 512 may be formed to surround and encapsulate all of the semiconductor dies 510. In the exemplary embodiment, the insulating encapsulant 512 is formed with a first portion 512-1 and a second portion 512-2 surrounding the first portion 512-1. In some embodiments, the first portion 512-1 of the insulating encapsulant 512 is encapsulating the semiconductor die 510, and has a planar first surface 512-1-S. In certain embodiments, the second portion 512-2 of the insulating encapsulant 512 has a planar second surface 512-2-S located at a different level than the planar first surface 512-1-S. In other words, a step height difference exists between the planar first surface 512-1-S and the planar second surface 512-2-S.

Furthermore, in some embodiments, a height H1 of the first portion 512-1 of the insulating encapsulant 512 is different than a height H2a of the second portion 512-2 of the insulating encapsulant 512. For example, the height H1 of the first portion 512-1 is greater than the height H2a of the second portion 512-2. In certain embodiments, the height H2a of the second portion 512-2 is less than half of the height H1 of the first portion 512-1. However, the disclosure is not limited thereto, and the heights of the first portion 512-1 and the second portion 512-2 of the insulating encapsulant 512 may be appropriately adjusted as long as height H1 is different than height H2a. In some embodiments, a ratio (H2a/H2b) of a height H2a of the second portion 512-2 to a width H2b of the second portion 512-2 is in a range of 0.6 to 4. In certain embodiments, the ratio (H2a/H2b) of the height H2a to the width H2b is controlled in the range of 0.6 to 4 so as to reduce a stress located at interfaces between the semiconductor package SM5 and an underfill structure 420 formed thereafter.

Furthermore, in the semiconductor package SM5, the redistribution structure 514 (or connection structure) is located on the first portion 512-1 of the insulating encapsulant 512 on the planar first surface 512-1-S, and being electrically connected to the semiconductor die 510. In some embodiments, the redistribution structure 514 includes a plurality of inter-dielectric layers 514B and a plurality of conductive layers 514A stacked alternately. Although two layers of the conductive layers 514A and three layers of inter-dielectric layers 514B are illustrated herein, however, the scope of the disclose is not limited by the embodiments of the disclosure. In other embodiments, the number of conductive layers 514A and the inter-dielectric layers 514B may be adjusted based on product requirement. In some embodiments, the conductive layers 514A are electrically connected to the conductive vias 510E of the semiconductor die 510.

In addition, in some embodiments, the conductive terminals 516 may be placed on the redistribution structure 514. In some embodiments, the topmost inter-dielectric layers 514B of the redistribution structure 514 may include a plurality of conductive pads 514C. The conductive pads 514C are for example, under-ball metallurgy (UBM) patterns used for ball mount. In certain embodiments, the conductive terminals 516 are placed on the conductive pads 514C through a ball placement process. In some embodiments, the conductive terminals 516 are electrically connected to the semiconductor die 510 through the conductive pads 514C and the conductive layers 514A of the redistribution structure 514. In certain embodiments, the conductive terminals 516 physically and electrically connects the semiconductor package SM5 to the contact pads 310 of the circuit substrate 300. In certain embodiments, the underfill structure 420 fill in the spaces between the circuit substrate 300 and the semiconductor package SM5, and covers up the second portion 512-2 of the insulating encapsulant 512.

Figure 17:
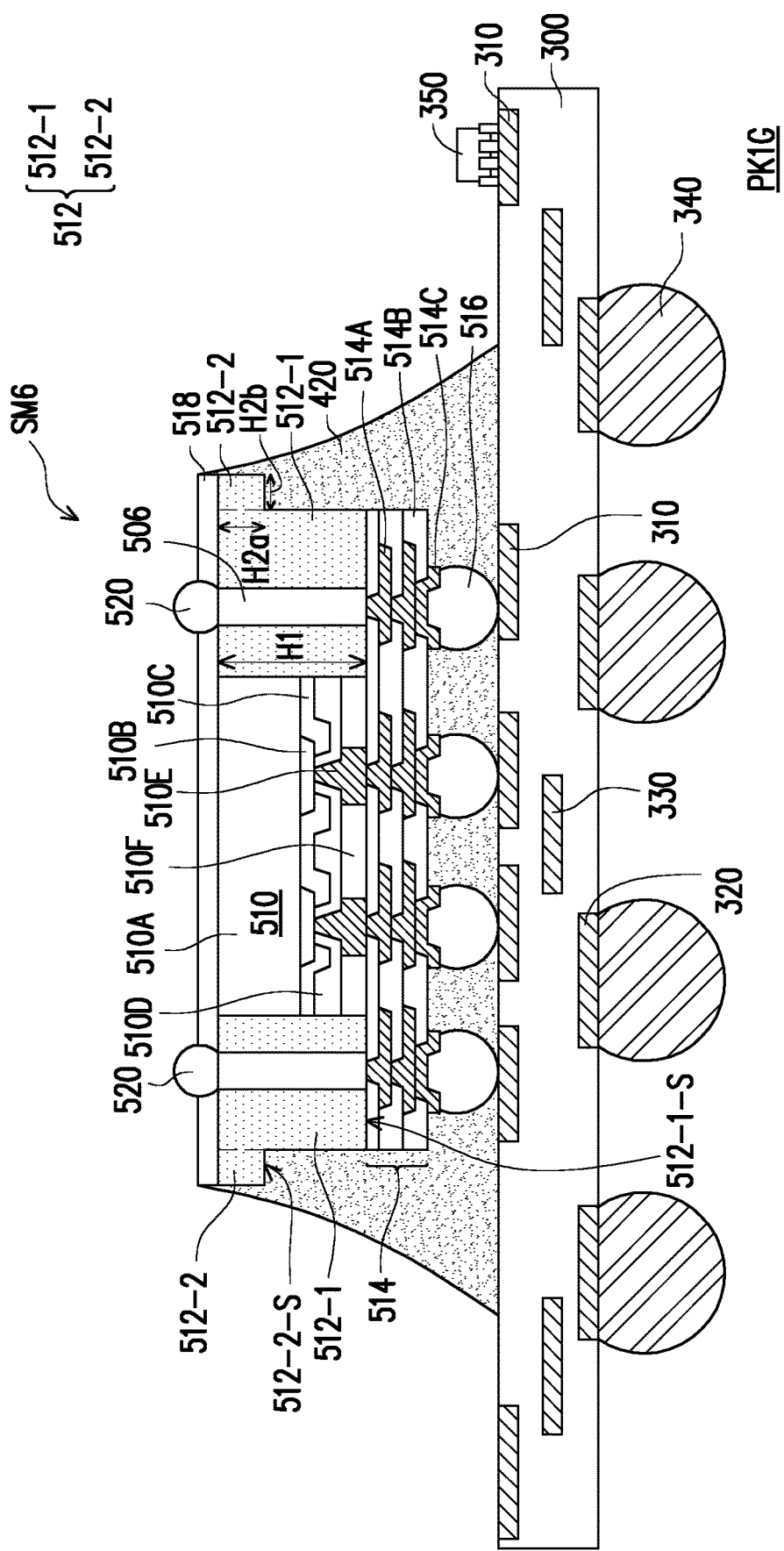
FIG. 17 is a schematic sectional view of a package structure according to some other exemplary embodiments of the present disclosure.

FIG. 17 is a schematic sectional view of a package structure according to some other exemplary embodiments of the present disclosure. The package structure PK1G illustrated in FIG. 17 is similar to the package structure PK1F illustrated in FIG. 16, hence the same reference numerals are used to refer to the same or liked parts, and its detailed description will be omitted herein. The difference between the embodiments is that through insulator vias 506 and conductive balls 520 are further provided in the semiconductor package SM6.

As illustrated in FIG. 17, a plurality of through insulator vias 506 are formed in the insulating encapsulant 512. For example, the through insulator vias 506 are embedded in the first portion 512-1 of the insulating encapsulant 512. In some embodiments, the formation of the through insulator vias 506 includes forming a mask pattern (not shown) with openings, then forming a metallic material (not shown) filling in the openings by electroplating or deposition, and removing the mask pattern to form the through insulator vias 506. Furthermore, a plurality of conductive balls 520 are formed on the through insulator vias 506, and being partially surrounded by the dielectric layer 518. In some embodiments, each of the conductive balls 520 are electrically connected to one of the through insulator vias 506, and electrically connected to the redistribution structure 514 by the through insulator vias 506. For example, the conductive balls 520 may further provide electrical connection to other components. In other words, the semiconductor package SM6 having dual side terminals is accomplished.

Figure 18:
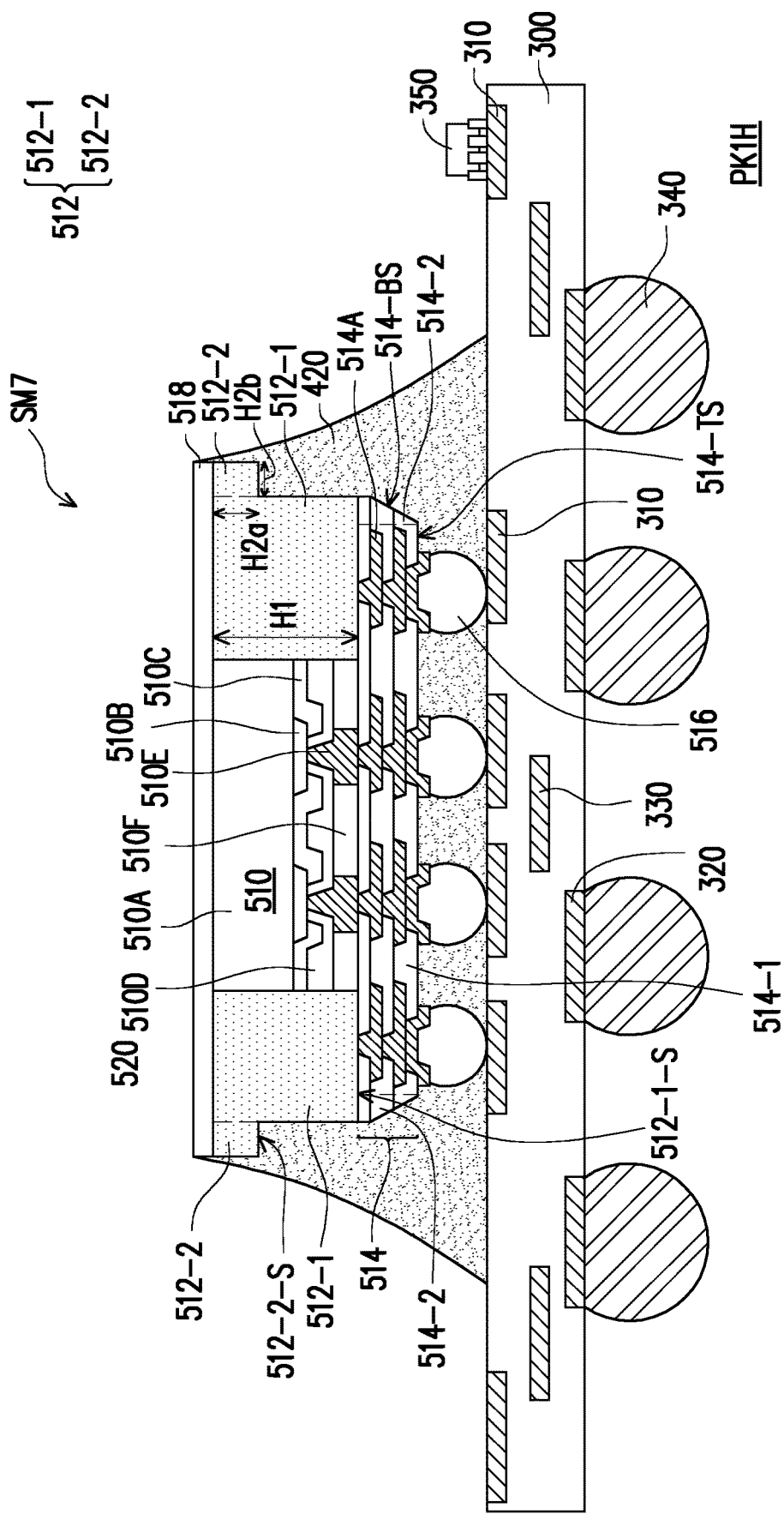
FIG. 18 is a schematic sectional view of a package structure according to some other exemplary embodiments of the present disclosure.

FIG. 18 is a schematic sectional view of a package structure according to some other exemplary embodiments of the present disclosure. The package structure PK1H illustrated in FIG. 18 is similar to the package structure PK1F illustrated in FIG. 16, hence the same reference numerals are used to refer to the same or liked parts, and its detailed description will be omitted herein. The difference between the embodiments is in the design of the redistribution structure 514 (connection structure).

As illustrated in FIG. 18, in the semiconductor package SM7, the redistribution structure 514 (connection structure) is formed with a first portion 514-1 and a second portion 514-2 surrounding the first portion 514-1. In some embodiments, the first portion 514-1 of the redistribution structure 514 is formed with a planar top surface 514-TS. Furthermore, the second portion 514-2 of the redistribution structure 514 is formed with a beveled surface 514-BS that is joined with the planar top surface 514-TS. In some embodiments, the beveled surface 514-BS has a step height difference to the planar second surface 512-2-S of the insulating encapsulant 512.

In the above-mentioned embodiments, the package structure includes at least a semiconductor package having an insulating encapsulant and connection structure (interposer or redistribution structure) with protruding portions and/or beveled portions. As such, a stress located at interfaces between the semiconductor package and an underfill structure may be reduced. Due to the relieved stress, cracking or delamination of the underfill structure may be reduced, and better adhesion between the insulating encapsulant and the semiconductor package may be achieved. Furthermore, a bleeding or creeping issue of the underfill structure to adjacent components (e.g. passive components) may be prevented.

In accordance with some embodiments of the present disclosure, a package structure including a circuit substrate and a semiconductor package is provided. The semiconductor package is disposed on the circuit substrate, and includes a plurality of semiconductor dies, an insulating encapsulant and a connection structure. The insulating encapsulant comprises a first portion and a second portion protruding from the first portion, the first portion is encapsulating the plurality of semiconductor dies and has a planar first surface, and the second portion has a planar second surface located at a different level than the planar first surface. The connection structure is located over the first portion of the insulating encapsulant on the planar first surface, and located on the plurality of semiconductor dies, wherein the connection structure is electrically connected to the plurality of semiconductor dies and the circuit substrate.

In accordance with some other embodiments of the present disclosure, a package structure including a circuit substrate, an interposer structure, a plurality of semiconductor dies, and an insulating encapsulant is provided. The interposer structure is disposed on the circuit substrate and includes a core portion, a plurality of through vias, and a redistribution structure. The plurality of through vias is formed in the core portion. The redistribution structure is located on the core portion and electrically connected to the plurality of through vias and the circuit substrate. The plurality of semiconductor dies is disposed on the interposer structure and electrically connected to the plurality of through vias and the redistribution structure. The insulating encapsulant is disposed on the interposer structure and encapsulating the plurality of semiconductor dies, wherein the insulating encapsulant comprises a first portion and a second portion surrounding the first portion, the first portion is encapsulating the plurality of semiconductor dies and overlapped with the interposer structure, the second portion is non-overlapped with the interposer structure, and a height of the first portion is different than a height of the second portion.

In accordance with yet another embodiment of the present disclosure, a method of fabricating a package structure is described. The method includes forming a semiconductor package and attaching the semiconductor package onto a circuit substrate through a plurality of conductive terminals. The semiconductor package is formed by the following steps. A core portion having a plurality of package regions and a sub region separating each of the plurality of package regions is provided, wherein a plurality of through vias is formed in the core portion in the plurality of package regions. A plurality of semiconductor dies is attached on a first surface of the core portion in each of the plurality of package regions, wherein the plurality of semiconductor dies is electrically connected to the plurality of though vias. An insulating encapsulant is formed on the first surface of the core portion in the plurality of package regions and the sub region, and to encapsulate the plurality of semiconductor dies. A redistribution structure is formed to be located on a second surface of the core portion opposite to the first surface, and in the plurality of package regions and the sub region. The redistribution structure is electrically connected to the plurality of through vias, and wherein the core portion, the plurality of through vias, and the redistribution structure constitute an interposer structure. A sawing process is performed to remove portions of the interposer structure and portions of the insulating encapsulant in the sub region, so that the insulating encapsulant is formed with a first portion and a second portion protruding from the first portion, the first portion is encapsulating the plurality of semiconductor dies and has a planar first surface, and the second portion has a planar second surface located at a different level than the planar first surface. The plurality of package regions is separated from one another after the sawing process to form the semiconductor package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a circuit substrate; and
   a semiconductor package disposed on the circuit substrate, wherein the semiconductor package comprises:
      a plurality of semiconductor dies;
      an insulating encapsulant, wherein the insulating encapsulant comprises a first portion and a second portion protruding from the first portion, the first portion is encapsulating the plurality of semiconductor dies and has a planar first surface, and the second portion has a planar second surface located at a different level than the planar first surface; and
      a connection structure located over the first portion of the insulating encapsulant on the planar first surface, and located on the plurality of semiconductor dies, wherein the connection structure is electrically connected to the plurality of semiconductor dies and the circuit substrate.

2. The package structure according to claim 1, further comprising an underfill structure filling in spaces between the circuit substrate and the semiconductor package, wherein the underfill structure covers the planar second surface of the insulating encapsulant.

3. The package structure according to claim 2, wherein the underfill structure further covers sidewalls of the second portion of the insulating encapsulant.

4. The package structure according to claim 1, wherein the semiconductor package further comprises a plurality of electrical connectors located between the plurality of semiconductor dies and the connection structure, and a first underfill covering the plurality of electrical connectors and filling in spaces between the plurality of semiconductor dies and the connection structure.

5. The package structure according to claim 1, wherein the insulating encapsulant further comprises a connecting portion located in between the first portion and the second portion, the connecting portion has a beveled surface that is joined with the planar first surface, and has a step height difference to the planar second surface.

6. The package structure according to claim 1, wherein the connection structure has a first portion and a second portion surrounding the first portion, the first portion has a planar top surface, and the second portion has a beveled surface that is joined with the planar top surface.

7. The package structure according to claim 1, wherein the connection structure has a first portion and a second portion surrounding the first portion, the first portion has a planar top surface, and the second portion has a beveled surface having a step height difference to the planar top surface.

8. A package structure, comprising:
a circuit substrate;
an interposer structure disposed on the circuit substrate, wherein the interposer structure comprises:
  a core portion;
  a plurality of through vias formed in the core portion; and
  a redistribution structure located on the core portion and electrically connected to the plurality of through vias and the circuit substrate;
a plurality of semiconductor dies disposed on the interposer structure and electrically connected to the plurality of through vias and the redistribution structure; and
an insulating encapsulant disposed on the interposer structure and encapsulating the plurality of semiconductor dies, wherein the insulating encapsulant comprises a first portion and a second portion surrounding the first portion, the first portion is encapsulating the plurality of semiconductor dies and overlapped with the interposer structure, the second portion is non-overlapped with the interposer structure, and a height of the first portion is different than a height of the second portion.

9. The package structure according to claim 8, further comprising an underfill structure filling in spaces between the circuit substrate and the interposer structure, wherein the underfill structure covers the second portion of the insulating encapsulant.

10. The package structure according to claim 9, wherein the underfill structure further covers sidewalls of the second portion of the insulating encapsulant.

11. The package structure according to claim 8, wherein the plurality of semiconductor dies is electrically connected to the plurality of through vias and the redistribution structure through a plurality of electrical connectors, and the package structure further comprises a first underfill covering the plurality of electrical connectors and filling in spaces between the plurality of semiconductor dies and the interposer structure.

12. The package structure according to claim 8, wherein the insulating encapsulant further comprises a beveled portion that joins the second portion to the first portion.

13. The package structure according to claim 8, wherein the interposer structure has a first portion and a second portion surrounding the first portion, the first portion has a planar top surface, the second portion has a beveled surface that is joined with the planar top surface.

14. The package structure according to claim 8, wherein the interposer structure has a first portion and a second portion surrounding the first portion, the first portion has a planar top surface, and the second portion has a beveled surface having a step height difference to the planar top surface.

15. A method of fabricating a package structure, comprising:
forming a semiconductor package, which comprises:
  providing a core portion having a plurality of package regions and a sub region separating each of the plurality of package regions, wherein a plurality of through vias is formed in the core portion in the plurality of package regions;
  attaching a plurality of semiconductor dies on a first surface of the core portion in each of the plurality of package regions, wherein the plurality of semiconductor dies is electrically connected to the plurality of though vias;
  forming an insulating encapsulant on the first surface of the core portion in the plurality of package regions and the sub region, and to encapsulate the plurality of semiconductor dies;
  forming a redistribution structure located on a second surface of the core portion opposite to the first surface, and in the plurality of package regions and the sub region, the redistribution structure electrically connected to the plurality of through vias, wherein the core portion, the plurality of through vias, and the redistribution structure constitute an interposer structure;
  performing a sawing process to remove portions of the interposer structure and portions of the insulating encapsulant in the sub region, so that the insulating encapsulant is formed with a first portion and a second portion protruding from the first portion, the first portion is encapsulating the plurality of semiconductor dies and has a planar first surface, and the second portion has a planar second surface located at a different level than the planar first surface;
  separating the plurality of package regions from one another after the sawing process to form the semiconductor package; and
attaching the semiconductor package onto a circuit substrate through a plurality of conductive terminals.

16. The method of fabricating the package structure according to claim 15, wherein the sawing process comprises:
performing a first sawing process to remove portions of the interposer structure and portions of the insulating encapsulant in the sub region to form a first trench; and
performing a second sawing process in the first trench by sawing through the insulating encapsulant.

17. The method of fabricating the package structure according to claim 15, wherein the sawing process comprises:
performing a first sawing process to remove portions of the interposer structure in the sub region to form a beveled first trench;
performing a second sawing process in the beveled first trench to remove portions of the interposer structure and portions of the insulating encapsulant in the sub region, and to form a second trench through the beveled first trench; and
performing a third sawing process in the second trench by sawing through the insulating encapsulant.

18. The method of fabricating the package structure according to claim 15, wherein the sawing process comprises:
performing a first sawing process to remove portions of the interposer structure and portions of the insulating encapsulant in the sub region to form a beveled first trench;
performing a second sawing process in the beveled first trench to remove portions of the insulating encapsulant in the sub region, and to form a second trench through the beveled first trench; and
performing a third sawing process in the second trench by sawing through the insulating encapsulant.

19. The method of fabricating the package structure according to claim 15, wherein the sawing process comprises:
- performing a first sawing process to remove portions of the interposer structure and portions of the insulating encapsulant in the sub region to form a first trench, wherein the first trench has planar side surfaces and beveled surfaces joined with the planar side surfaces;
- performing a second sawing process in the first trench to remove portions of the insulating encapsulant in the sub region, and to form a second trench through the first trench; and
- performing a third sawing process in the second trench by sawing through the insulating encapsulant.

20. The method of fabricating the package structure according to claim 15, further comprises forming an underfill structure filling in spaces between the circuit substrate and the semiconductor package, wherein the underfill structure covers the second portion of the insulating encapsulant.

* * * * *